(12) United States Patent
Kim et al.

(10) Patent No.: US 8,391,057 B2
(45) Date of Patent: Mar. 5, 2013

(54) SWITCH AND METHOD OF FORMING THE SAME

(75) Inventors: Min-Sang Kim, Seoul (KR); Ji-Myoung Lee, Yongin-si (KR); Hyun-Jun Bae, Suwon-si (KR); Dong-Won Kim, Seongnam-si (KR); Jun Seo, Yongin-si (KR); Yong-Hyun Kwon, Hwaseong-si (KR); Weon-Wi Jang, Seoul (KR); Keun-Hwi Cho, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 686 days.

(21) Appl. No.: 12/533,581

(22) Filed: Jul. 31, 2009

(65) Prior Publication Data

US 2010/0135064 A1  Jun. 3, 2010

(30) Foreign Application Priority Data

Dec. 2, 2008 (KR) .............................. 2008-0121327

(51) Int. Cl.
 *G11C 11/50* (2006.01)
 *H01L 27/108* (2006.01)
(52) U.S. Cl. ................ 365/164; 257/296; 257/E27.084; 365/149

(58) Field of Classification Search .................. 257/296, 257/532, E27.084; 365/164, 149
See application file for complete search history.

(56) References Cited

U.S. PATENT DOCUMENTS

| 6,836,424 | B2 | 12/2004 | Segal et al. | |
|---|---|---|---|---|
| 7,705,372 | B2 * | 4/2010 | Yun et al. | 257/209 |
| 7,710,768 | B2 * | 5/2010 | Naito | 365/164 |
| 2008/0035928 | A1 * | 2/2008 | Yun et al. | 257/67 |
| 2008/0049491 | A1 * | 2/2008 | Park | 365/164 |
| 2008/0093686 | A1 * | 4/2008 | Yun et al. | 257/415 |

FOREIGN PATENT DOCUMENTS

| JP | 2004-063605 | 2/2004 |
|---|---|---|
| JP | 2005-243576 | 9/2005 |
| KR | 1020050113167 | 12/2005 |
| KR | 1020060068914 | 6/2006 |
| KR | 100621827 | 9/2006 |
| KR | 100818239 | 3/2008 |
| WO | WO 2006137455 A1 * | 12/2006 |

* cited by examiner

*Primary Examiner* — Allison P Bernstein
(74) *Attorney, Agent, or Firm* — F. Chau & Associates, LLC.

(57) ABSTRACT

A memory device includes a memory cell that includes a storage node, a first electrode, and a second electrode, the storage node stores an electrical charge, and the first electrode moves to connect to the storage node when the second electrode is energized.

24 Claims, 28 Drawing Sheets

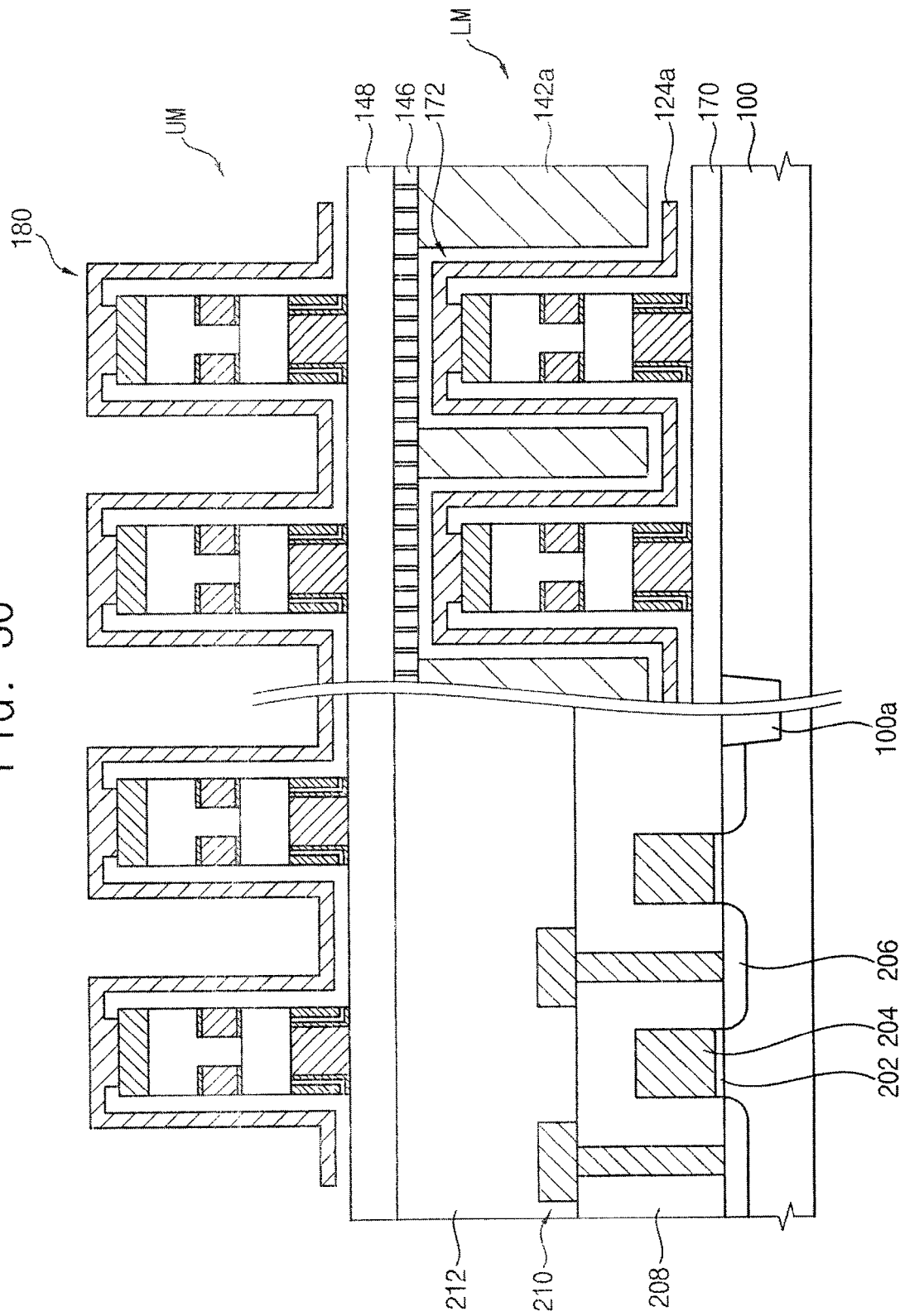

SWITCH AND METHOD OF FORMING THE SAME

CROSS REFERENCE TO RELATED APPLICATION

The present application claims priority to Korean patent application 2008-0121327 filed on Dec. 2, 2008 with the Korean Intellectual Property Office (KIPO), the entire contents of which are incorporated herein by reference.

TECHNICAL FIELD

The present disclosure relates to an electromechanical switch and a method of forming the same, and more particularly to an electromechanical switch having an electrode movably connected to a storage node and a method of forming the same.

DISCUSSION OF RELATED ART

Dynamic RAM (DRAM) is a solid state memory that requires refreshing to keep the data active. A memory cell in a DRAM includes a capacitor and a MOS transistor. The capacitor's charge decays, due to leakage, so the memory must be periodically refreshed to maintain the charge. The MOS transistor acts as a switch in the memory cell. If the memory is to be read, the voltage on the capacitor is detected on the data line by a sense amplifier. If a write or refresh operation is called for, the data line becomes an input line. When the proper address turns on the MOS transistor in the DRAM cell, the capacitor can be charged or recharged from data-in.

One way to increase the capacity of the DRAM is by reducing the size of the MOS transistors. However, reducing the size of MOS transistors raises other issues such as short channel or junction leakage. Further, when a MOS transistor is used in a memory cell, a semiconductor substrate must be used to accommodate the MOS transistor thereon, and the semiconductor substrate must be formed between upper and lower arrays of memory cells having the MOS transistors.

A need therefore exists for an improved switching device for use in a memory device.

SUMMARY OF THE INVENTION

According to an exemplary embodiment of the present invention, a memory device comprises a memory cell that includes a storage node, a first electrode, and a second electrode, the storage node stores an electrical charge, and the first electrode moves to connect to the storage node when the second electrode is energized.

The memory device may further comprise a substrate on which the memory cell is formed.

The first electrode may comprise a vertical portion, a first horizontal portion, and a second horizontal portion, the vertical portion is substantially perpendicular with respect to the substrate and the first and second horizontal portions are substantially parallel with respect to the substrate.

A first end of the vertical portion can be connected to a first end of the first horizontal portion, a second end of the first horizontal portion is fixed to an insulator pattern formed over the second electrode, a second end of the vertical portion is connected to a first end of the second horizontal portion.

A gap can be formed between the vertical portion of the first electrode and the storage node and the second electrode.

The second end of the vertical portion can be separated from the storage node by the gap when the second electrode is not energized.

The second end of the vertical portion can contact the storage node when the second electrode is energized.

The second end of the vertical portion can be protruded toward the storage node.

The second electrode can be energized when a voltage is applied.

The storage node can comprise a capacitor, the first electrode comprises a bit line, and the second electrode comprises a word line.

According to an exemplary embodiment of the present invention, a memory device comprises a memory cell that includes a first electrode, a second electrode, and a storage node, the first electrode is separated from the second electrode with a first gap and is separated from the storage node with a second gap, and the first electrode moves to connect to the storage node when the second electrode is energized.

The first gap and the second gap can be substantially the same.

The first gap can be larger than the second gap.

According to an exemplary embodiment of the present invention, a memory device comprises a first memory cell including a first word line, a first capacitor, and a bit line, a second memory cell including a second word line, a second capacitor, and the bit line, and the bit line moves to connect to the first capacitor when the first word line is energized and the bit line moves to connect to the second capacitor when the second word line is energized.

The memory device may further comprise a substrate on which the first memory cell and the second memory cell are formed.

The bit line in the first memory cell may comprise a first vertical portion, the bit line in the second memory cell comprises a second vertical portion, the first and second vertical portions are substantially perpendicular with respect to the major horizontal plane of the substrate and substantially parallel with respect to each other.

An end of the first vertical portion can be separated from the first capacitor when the first word line is not energized, and the end of the first vertical portion contacts the first capacitor when the first word line is energized.

The end of the first vertical portion can be protruded toward the first capacitor.

An end of the second vertical portion can be separated from the second capacitor when the second word line is not energized, and the end of the second vertical portion contacts the second capacitor when the second word line is energized.

The end of the second vertical portion can be protruded toward the second capacitor.

The first word line and the second word line can be energized when a voltage is applied.

An insulator pattern can be formed over the first word line and the second word line, and the bit line is fixed to the insulator pattern.

The bit line can be substantially symmetrical with respect to the mask pattern.

According to an exemplary embodiment of the present invention, a memory device comprises a substrate, a capacitor formed on the substrate, the capacitor stores an electrical charge, a word line disposed over the capacitor, and a bit line fixed to an insulator pattern formed over the word line, the bit line is separated from the word line and the capacitor with a gap, the bit line having a vertical portion substantially perpendicular with respect to the substrate, the vertical portion of the bit line moves to connect to the capacitor when the word line is energized.

The memory device may further comprise a first interlayer dielectric layer formed between the word line and the capacitor.

The memory device may further comprise a second interlayer dielectric layer formed between the word line and the insulator pattern.

The bit line may further comprise a parallel portion, a first end of the parallel portion is connected to a first end of the vertical portion and a second end of the parallel portion is fixed to the insulator pattern.

A second end of the vertical portion of the bit line can be separated from the capacitor when the word line is not energized.

A second of the vertical portion of the bit line can contact the capacitor when the word line is energized.

The second end of the vertical portion can be protruded toward the capacitor.

The word line can be energized when a voltage is applied.

The bit line may comprise at least two layers.

According to an exemplary embodiment of the present invention, a memory device comprises a memory cell that includes a capacitor, a word line, and a beam line, the memory cell formed on a conductive plate disposed on a substrate, a first end of the beam line is disposed on the conductive plate, the beam line is substantially perpendicular with respect to the substrate, and a second end of the beam line moves to connect to the capacitor when the word line is energized.

BRIEF DESCRIPTION OF DRAWINGS

Exemplary embodiments of the present invention can be understood in more detail from the following descriptions taken in conjunction with the accompanying drawings, in which:

FIG. 30 shows a memory device according to an exemplary embodiment of the present invention;

DESCRIPTION OF EXEMPLARY EMBODIMENTS

Figure 1:
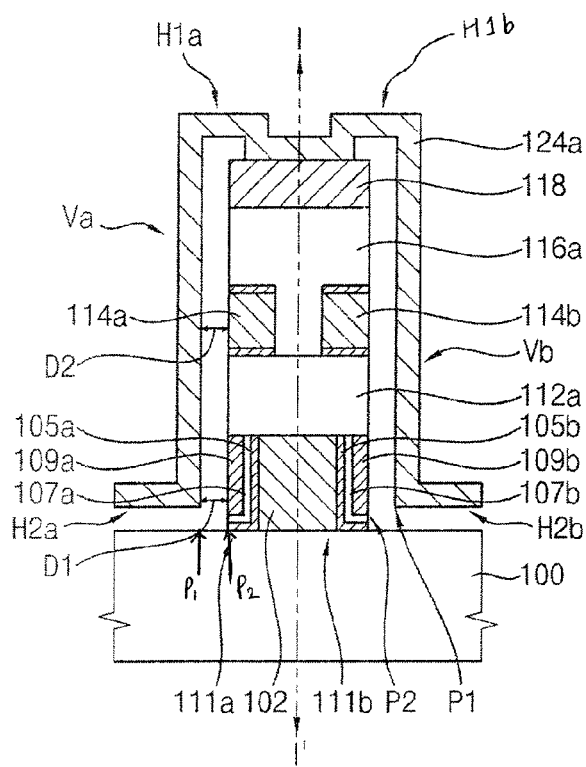
FIG. 1 is a sectional view showing an electromechanical switch according to an exemplary embodiment of the present invention.

The present invention will now be described more fully with reference to the accompanying drawings in which exemplary embodiments of the invention are shown. This invention may, however, be embodied in many different forms and should not be construed as limited to the exemplary embodiments set forth herein.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the exemplary embodiments.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "vertical" refers to a direction that is substantially orthogonal to a horizontal direction.

Example embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

FIG. 1 is a sectional view showing an electromechanical switch according to an exemplary embodiment of the present invention. The electromechanical switch can be used in a memory cell constituting a memory device such as, for example, a Dynamic Random Access Memory (DRAM). The electromechanical switch can also be used in electronic devices other than the memory device.

Referring to FIG. 1, a memory cell includes a storage node, a first electrode, and a second electrode. The storage node is an electrical node of a charge storing device. In an exemplary embodiment, the storage node can be an electrical node of a capacitor 111a. In an exemplary embodiment, the storage node can be a node of a conductive pattern surrounded by an insulator. The first electrode can be a word line 114a. The second electrode can be a bit line 124a. A voltage sensing circuit can be located at an end of the bit line 124a. When electrically connected, electrical charges can move from the capacitor 111a to the voltage sensing circuit via the bit line 124a.

The capacitor 111a may include an upper electrode 109a, a lower electrode 105a, and a dielectric layer 107a formed between the upper and lower electrode 109a and 105a. The bit line 124a can be disposed over the word line 114a with an interlayer dielectric layer 116a therebetween. The word line 114a can be disposed over the capacitor 111a with an interlayer dielectric layer 112a therebetween. The capacitor 111a can be formed on a substrate 100. The substrate 100 may comprise, for example, glass, semiconductor or plastic. In an exemplary embodiment, a first side of the lower electrode 105a contacts the substrate 100. A first side of a conductive plate 102 is formed on the substrate 100. A second side of the lower electrode 105a contacts a second side of the conductive plate 102.

In an exemplary embodiment, a first memory cell and a second memory cell can have a mirror image with respect to an imaginary line I-I'. The first memory cell includes the bit line 124a, the capacitor 111a, and the word line 114a, and the second memory cell includes the bit line 124a, a capacitor 111b, and a word line 114b. The bit line 124a crosses the word line 114a of the first memory cell and the word line 114b of the second memory cell. The capacitor 111b of the second memory includes an upper electrode 109b, a lower electrode 105b, and a dielectric layer 107b formed therebetween.

In an exemplary embodiment, the bit line 124a is separated from the word line 114a and the capacitor 111a, is separated from the word line 114b and the capacitor 111a, and is separated from the substrate 100 with a gap therebetween. The bit line 124a can move in the gap based on an electromagnetic power generated between the word line 114a and the bit line 124a. In an exemplary embodiment, the bit line 124a is disposed on and fixed to a mask pattern 118 formed on the interlayer dielectric layer 116a. In an exemplary embodiment, the bit line 124a can be fixed to the mask pattern 118a when the bit line 124a is deposited on the mask pattern without using an adhesive. As such, the bit line 124a is formed substantially symmetrical with respect to the imaginary line I-I'.

Figure 2:
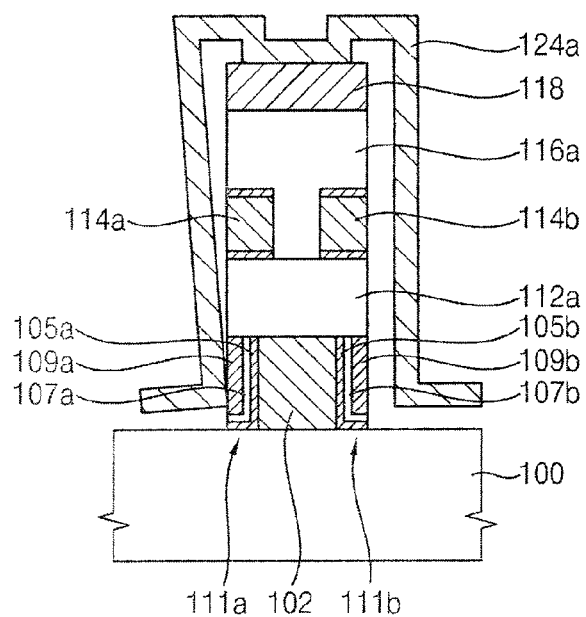
FIG. 2 is a sectional view showing an electromechanical switch according to an exemplary embodiment of the present invention.
Figure 6:
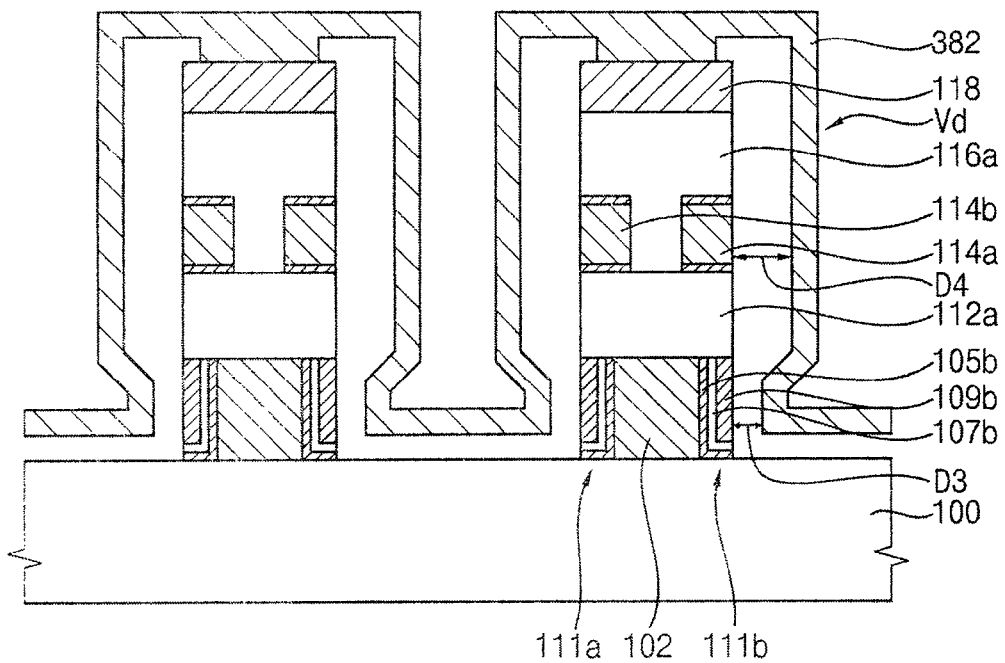
FIG. 6 is a sectional view of an electromechanical switch according to an exemplary embodiment of the present invention.
Figure 31:
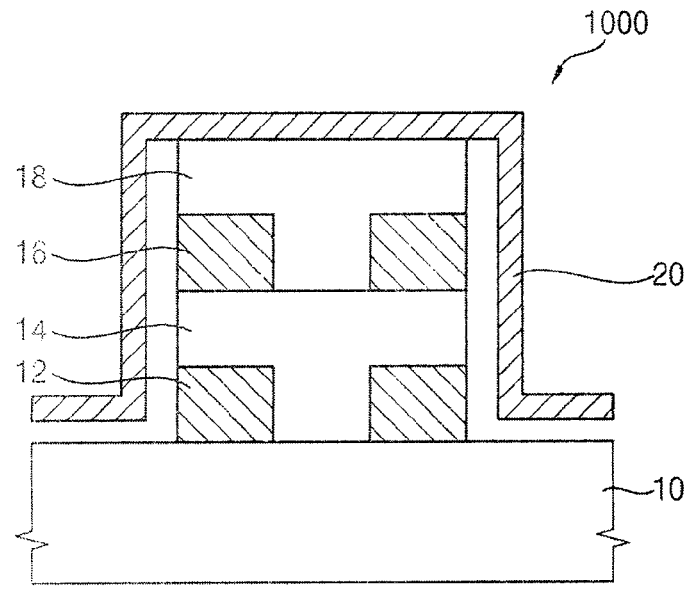
FIG. 31 shows an electromechanical switch according to an exemplary embodiment of the present invention.

FIG. 2 is a sectional view showing an electromechanical switch according to an exemplary embodiment of the present invention. Referring to FIG. 1 and FIG. 2, the bit line 124a can be movably connected to the upper electrode 109a of the capacitor 111a when the word line 114a is energized. The word line 114a can be energized when a voltage is applied. The bit line 124a includes a first horizontal portion H1a, a second horizontal portion H2a, and a vertical portion Va in the first memory cell. The bit line 124a includes a first horizontal portion H1b, a second horizontal portion H2b, and a vertical portion Vb in the second memory cell. An upper end of the vertical portion Va is connected to a left end of the horizontal portion H1a. A right end of the horizontal portion H1a is fixed on the mask pattern 118. A right end of the horizontal portion H2a is connected to a lower end of the vertical portion Va. A left end of the horizontal portion H2a is connected to another lower end of a vertical portion of an adjacent memory cell. In an exemplary embodiment, the first horizontal portion H1a, H1b can be formed with a recessed portion and a protruding portion as shown in FIG. 1. In an exemplary embodiment, the first horizontal portion H1a, H1b can be formed substantially flat as shown in FIG. 6 or FIG. 31.

The vertical portion Va can be formed substantially perpendicular with respect to the major horizontal plane of the substrate 100 when the word line 114a is not energized. The first and second horizontal portion H1a, H2a can be formed substantially parallel with respect to the major horizontal plane of the substrate 100. The vertical portion Va is substantially perpendicular with respect to the first and second horizontal portion H1a, H2a. Since the vertical portions Va and Vb of the bit line 124a are substantially perpendicular with respect to the substrate 100, a footprint of a unit memory cell can be minimized. As such, a high density memory device can be achieved according to an exemplary embodiment of the present invention.

The lower end of the vertical portion Va is separated from the upper electrode 109a of the capacitor 111a when the word line 114a is not energized. The lower end of the vertical portion Va moves to connect to the upper electrode 109a when the word line 114a is energized. Similarly, in the second memory cell, a lower end of the vertical portion Vb moves to connect to the upper electrode 109b when the word line 114b is energized. The movement of the vertical portion Va in the first memory cell does not affect the movement of the vertical portion Vb in the second memory cell. That is, the lower end of the vertical portion Va moves to contact the upper electrode 109a while the vertical portion Vb is stationary.

The capacitor 111a can be disposed near the lower end of the vertical portion Va of the bit line 124a. The upper electrode 109a can have, for example, a substantially rectangular shape. The lower end of the vertical portion Va contacts a surface of the upper electrode 109a. The contact between the lower end of the vertical portion Va and the surface of the upper electrode 109a can be a point, line or surface contact according to an exemplary embodiment of the present invention.

When the word line 114a pulls the vertical portion Va of the bit line 124a, a distance between the word line 114a and the vertical portion Va becomes smaller, but the word line 114a and the vertical portion Va do not contact with each other. However, the lower end of the vertical portion Va contacts the upper electrode 109a of the capacitor 111a. In a data write operation, the capacitor 111a is charged with electrons through the contact. In a data read operation, the word line 114a pulls the vertical portion Va of the bit line 124a, and the lower end of the vertical portion Va contacts the upper electrode 109a. With the contact, the bit line 124a senses the existence of electrons in the capacitor 111a. In the second memory cell, the vertical portion Vb of the bit line 124a contacts the capacitor 111b when the word line 114b pulls the vertical portion Vb. As such, the vertical portion Va is movably connected to the capacitor 111a when the word line 114a is energized, and the vertical portion Vb is movably connected to the capacitor 111b when the word line 114b is energized.

The lower end of the vertical portion Va moves from a first position P1 to a second position P2 for reading out the charge stored within the capacitor 111a or for writing the charge to the capacitor 111a. The lower end of the vertical portion Va is in the second position P2 to contact the capacitor 111a when the word line 114a is energized. In an exemplary embodiment, a first distance D1 between the first position P1 and the second position P2 is substantially the same as a second distance D2 between the word line 114a and a corresponding portion of the vertical portion Va. In an exemplary embodiment, the first distance D1 and the second distance D2 can be about 10 nm to about 15nm.

In an exemplary embodiment, the bit line 124a can be a single layer structure comprising, for example, Ti, TiN, a Ti metal alloy, Ta, TaN, a Ta metal alloy, or carbon nano tube. In an exemplary embodiment, the bit line 124a can be a two layer structure where a first layer is laminated on a second layer. For example, the first layer may comprise $SiO_2$ or SiN, and the second layer may comprise a conductive material such as Ti, TiN, a Ti metal alloy, Ta, TaN, a Ta metal alloy, or carbon nano tube. In an exemplary embodiment, the suspended beam line 160 can be a multilayer structure. For example, in a three layer structure, the first layer may comprise $SiO_2$, the second layer may comprise TiN, and the third layer may comprise TaN. The bit line 124a having two or more layers with different materials can be more flexible as compared with a single material layer bit line.

Figure 3:
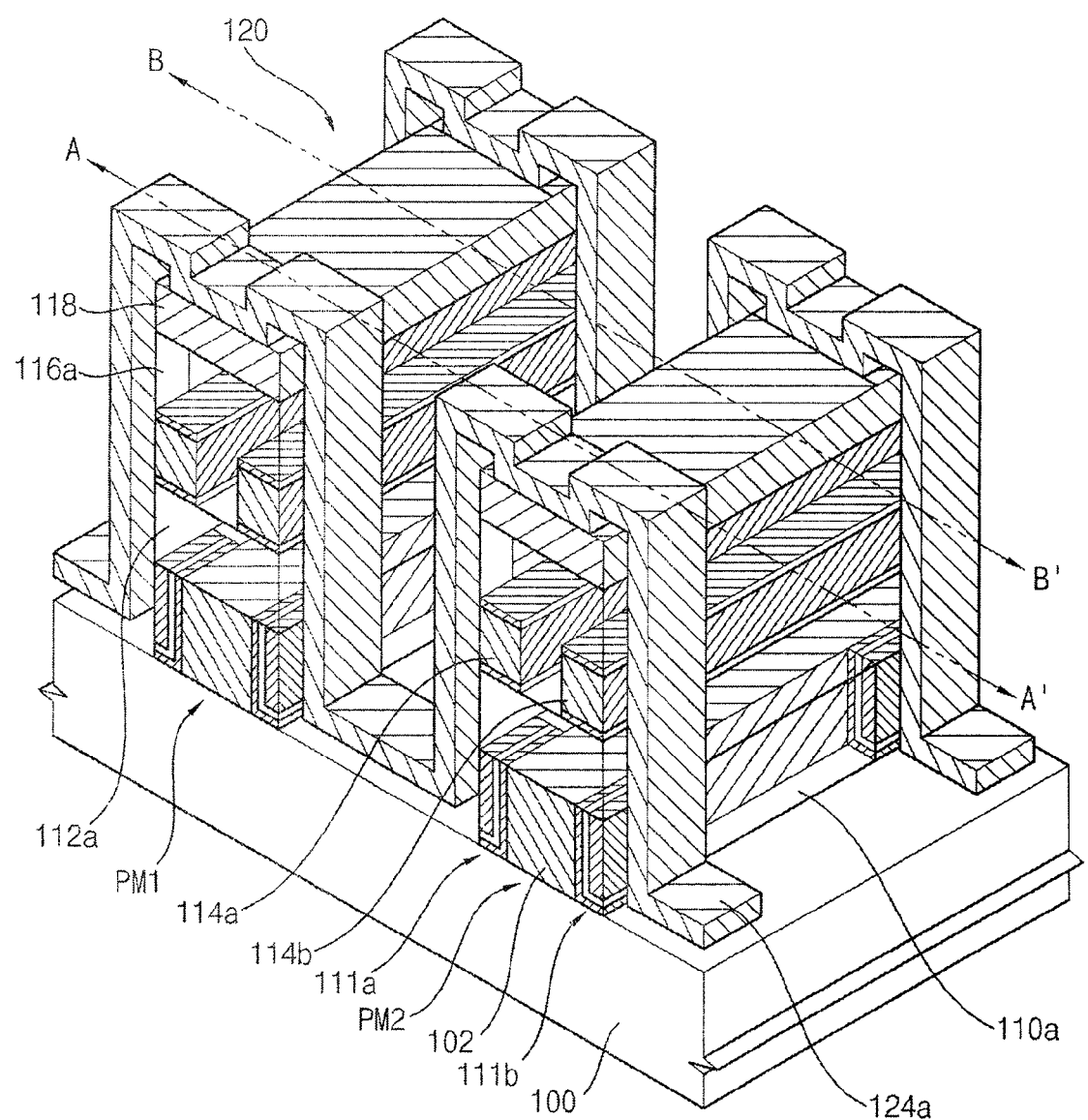
FIG. 3 is a perspective view showing an electromechanical switch according to an exemplary embodiment of the present invention.

FIG. 3 is a perspective view showing an electromechanical switch according to an exemplary embodiment of the present invention. A first pair of memory cells PM1 includes the first memory cell and the second memory cell. A second pair of memory cells PM2 includes a third memory cell and a fourth memory cell. The first pair of memory cells PM1 and the second memory cells PM2 are connected through the bit line 124a. As such, along the bit line 124a, more than one pairs of memory cells can be connected and disposed, for example, in a regular interval. In the word line direction, more than one pairs of memory cells are disposed with an interval between the respective bit line 124a. Thus, an array of memory cells can be formed on the substrate 100. The line A-A' indicates an area of the memory device where the bit line 124a is formed. The line B-B' indicates an area of the memory device where the bit line 124a is not formed.

Figure 4:
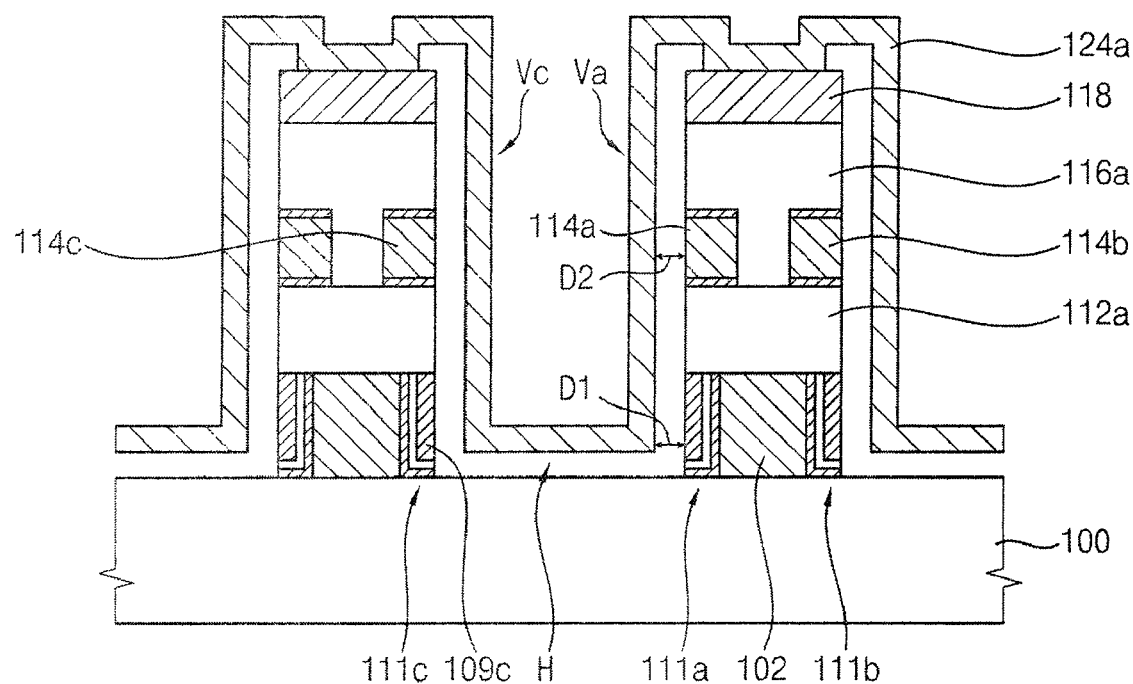
FIG. 4 is a sectional view of an electromechanical switch taken along the line A-A' in FIG. 3 according to an exemplary embodiment of the present invention.

FIG. 4 is a sectional view of an electromechanical switch taken along the line A-A' in FIG. 3 according to an exemplary embodiment of the present invention. A third memory cell having a word line 114c, a capacitor 111c, and a vertical portion Vc of the bit line 124a is formed adjacent to the first memory cell. The vertical portion Vc of the third memory cell can be connected to the vertical portion Va of the first memory cell through a horizontal portion H. When the word line 114c pulls the vertical portion Vc, a lower end of the vertical portion Vc contacts an upper electrode 109c of the capacitor 111c. Then, D1 becomes larger because the vertical portion Vc and the vertical portion Va are connected with each other.

Figure 5:
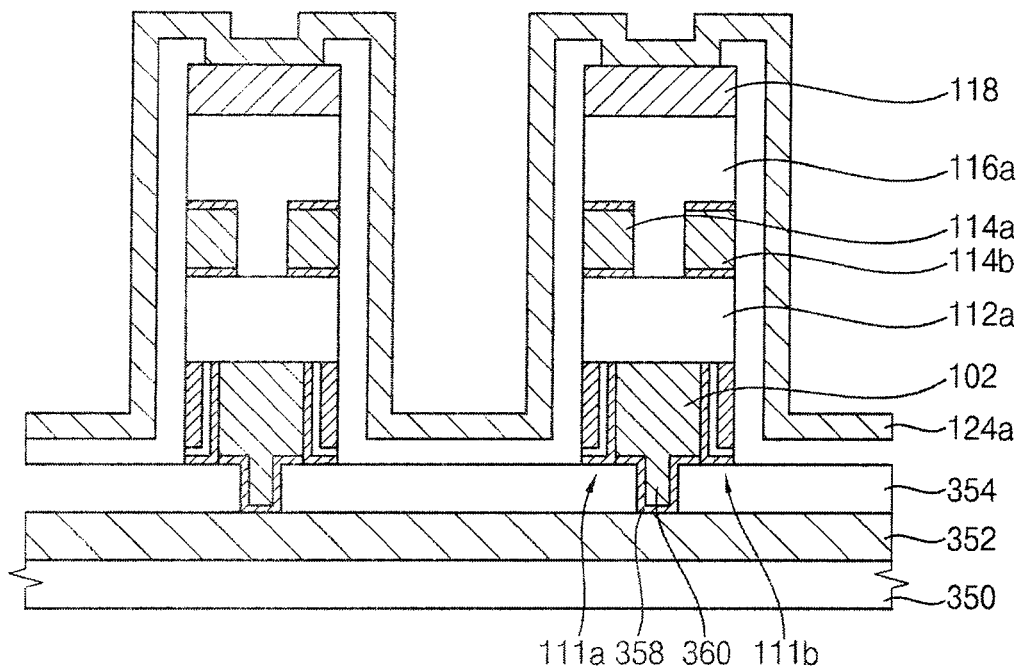
FIG. 5 is a sectional view of an electromechanical switch according to an exemplary embodiment of the present invention.

FIG. 5 is a sectional view of an electromechanical switch according to an exemplary embodiment of the present invention. Referring to FIG. 5, electromechanical switches are formed on a substrate 350 where a buried conductive pattern 352 is formed therein. An insulating layer 354 is formed on the buried conductive pattern 352. The conductive plate 102 can be connected to the buried conductive pattern 352 via a conductive pattern 360 formed through the insulating layer 354. A barrier layer 358 can be formed between the conductive pattern 360 and the buried conductive pattern 352. The buried conductive pattern 352 can function as a p-plate of a DRAM according to an exemplary embodiment of the present invention.

FIG. 6 is a sectional view of an electromechanical switch according to an exemplary embodiment of the present invention. Referring to FIG. 6, a lower end of the vertical portion Vd is protruded toward the capacitor 111b. A first distance D3 between the capacitor 111b and the protruded lower end of the vertical portion Vd is smaller than a second distance D4 between the word line 114b and the corresponding portion of the vertical portion Vd. In an exemplary embodiment, the first distance D3 can be about 10 nm to about 15 nm and the second distance D4 can be about 20 nm to about 25 nm. The vertical portion Vd of a bit line 382 can be prevented from contacting the word line 114b when the word line 114b pulls the vertical portion Vd because D4 is larger than D3. That is, when D3 is zero, D4 still can maintain a distance. If the word line 114b contacts the vertical portion Vd of the bit line 382, damage may occur in the word line 114b and/or the vertical portion Vd of the bit line 382. In an exemplary embodiment, an operation voltage of the memory device can be lowered to maintain a minimum distance in D4.

Figure 7:
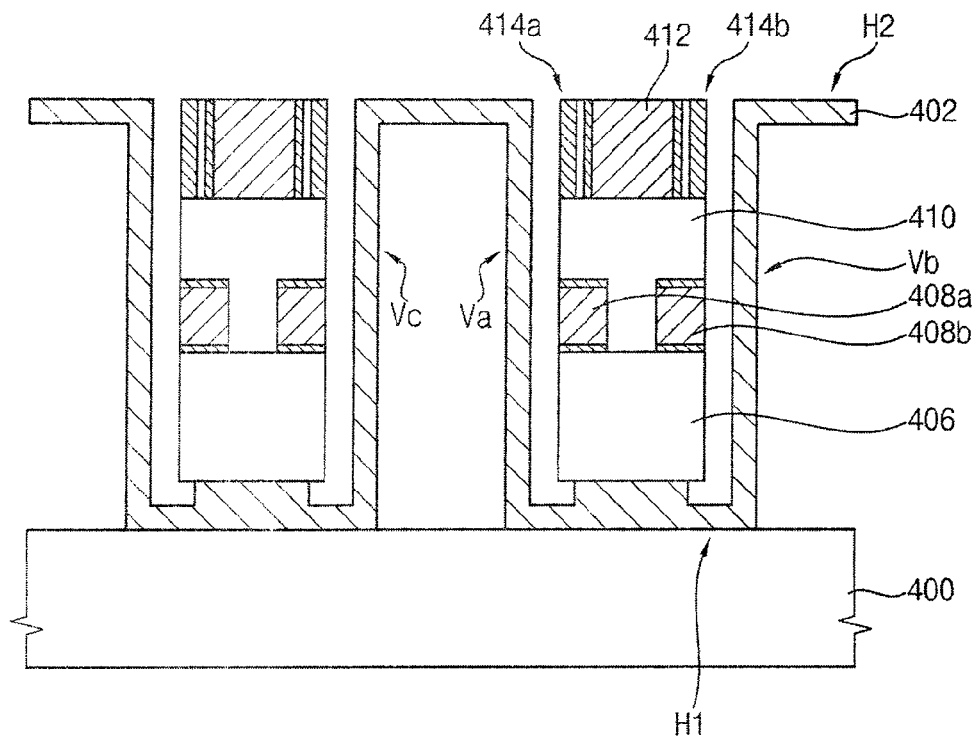
FIG. 7 is a sectional view of an electromechanical switch according to an exemplary embodiment of the present invention.

FIG. 7 is a sectional view of an electromechanical switch according to an exemplary embodiment of the present invention. Referring to FIG. 7, a bit line 402 including a first horizontal portion H1, a second horizontal portion H2, and vertical portions Va, Vb and Vc are formed on a substrate 400. Between two vertical portions Va and Vb, capacitors 414a and 414b, a conductive plate 412 and word lines 408a and 408b are formed. The first horizontal portion H1 of the bit line 402 is formed on the substrate 400. An interlayer dielectric layer 406 is formed on the horizontal portion H1. The word lines 408a and 408b are formed on the interlayer dielectric layer 406. An interlayer dielectric layer 410 is formed on the word lines 408a and 408b. The capacitors 414a and 414b are formed on the interlayer dielectric layer 410. The conductive plate 412 contacting the capacitors 414a and 414b is formed on the interlayer dielectric layer 410. When the word line 408a pulls the vertical portion Va, an upper end of the vertical portion Va moves to contact the capacitor 414a. When the word line 408b pulls the vertical portion Vb, an upper end of the vertical portion Vb moves to contact the capacitor 414b.

Figure 8:
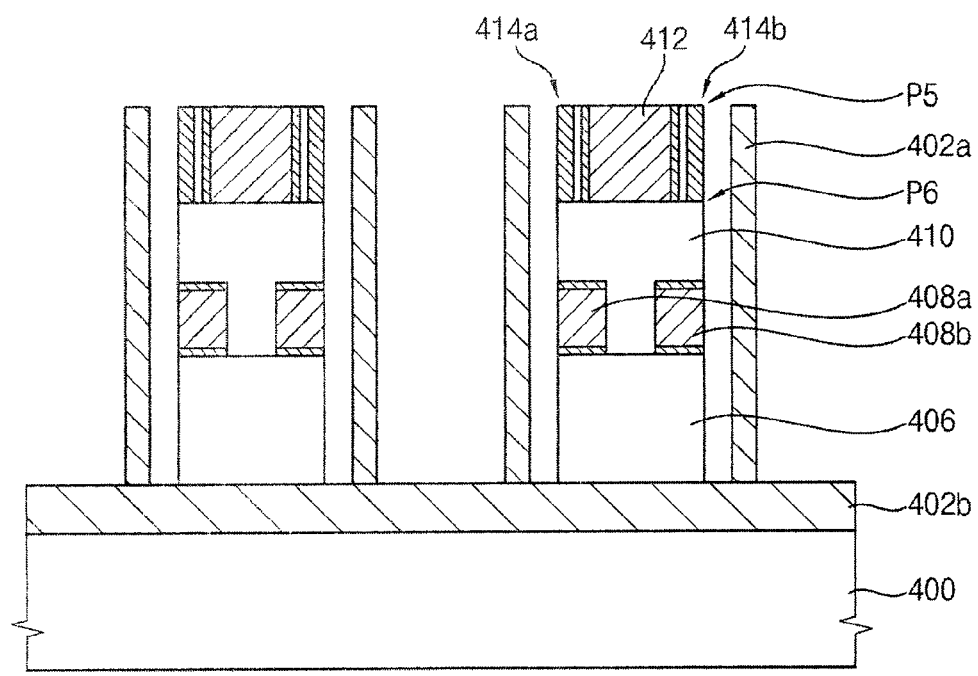
FIG. 8 is a sectional view showing an electromechanical switch according to an exemplary embodiment of the present invention.

FIG. 8 is a sectional view showing an electromechanical switch according to an exemplary embodiment of the present invention. Referring to FIG. 8, a surface conductive pattern 402b is formed on the substrate 400. A conductive beam 402a is formed on the surface conductive pattern 402b. The conductive beam 402a is substantially perpendicular with respect to the surface conductive pattern 402b and the substrate 400. Between two conductive beams, capacitors 414a and 414b, the conductive plate 412 and word lines 408a and 408b are formed. A space exists between the conductive beam 402a and the capacitor 414b and between the conductive beam 402a and the word line 408b. As such, when the word line 408b pulls the conductive beam 402a, an upper end of the conductive beam 402a moves to contact the capacitor 414b. When the word line 408b is not energized, the upper end of the conductive beam 402a returns to the original position. The height of the conductive beam 402a can be determined based on the location of the corresponding capacitor. For example, the upper end of the conductive beam 402a can be positioned between the upper end P5 and lower end P6 of the capacitor 414b.

Figure 9:
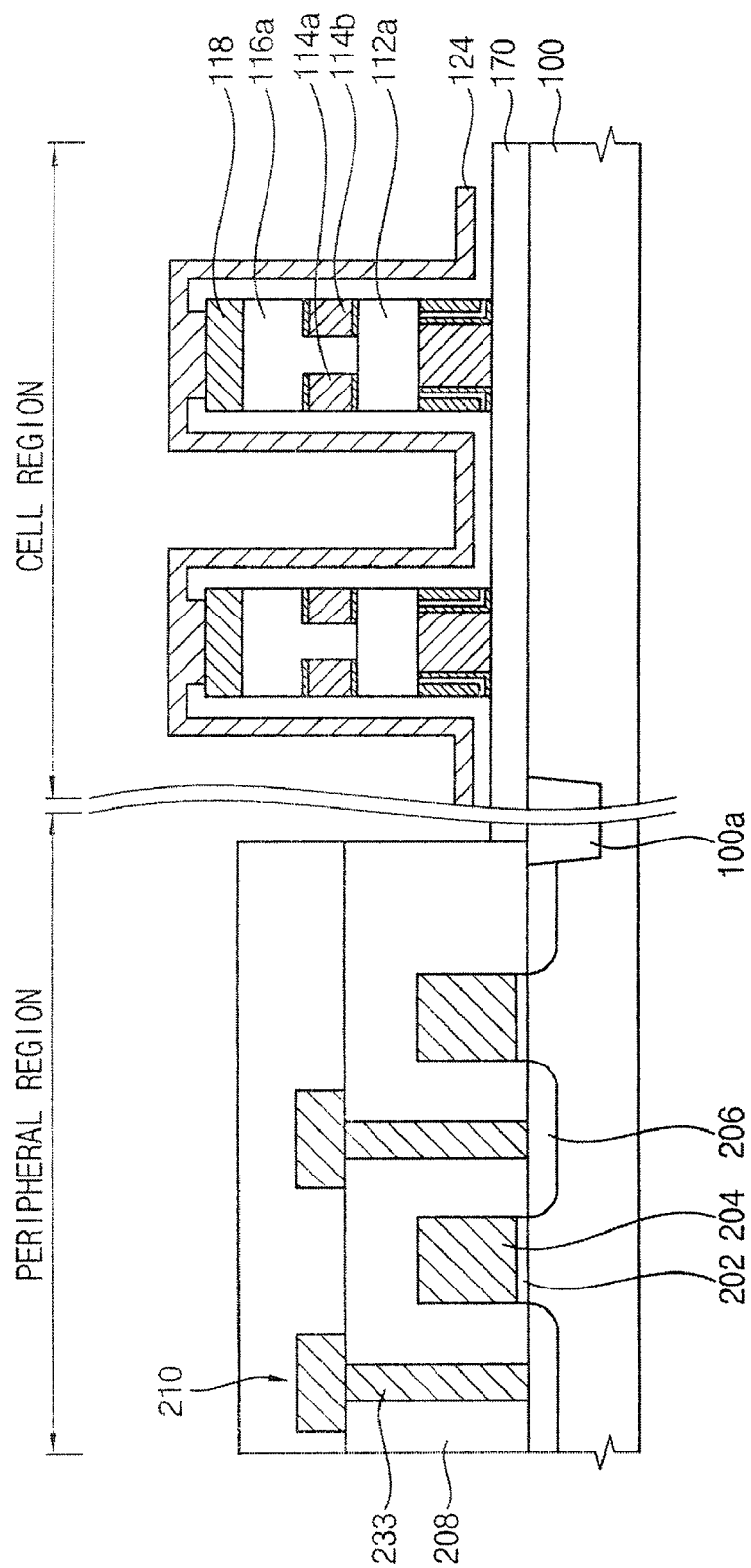
FIG. 9 is a sectional view showing a memory device according to an exemplary embodiment of the present invention.

FIG. 9 is a sectional view showing a memory device according to an exemplary embodiment of the present invention. Referring to FIG. 9, memory cells including an electromechanical switch are formed in a cell region, and metal oxide silicon (MOS) switches are formed in a peripheral region. In the peripheral region, a gate insulating layer 202 is formed on the semiconductor substrate 100. A gate electrode 204 is formed on the gate insulating layer 202. A source/drain region 206 is formed adjacent to the gate insulating layer 202. An interlayer dielectric layer 208 is formed on the gate electrode 204 and the source/drain region 206. A conductive pattern 210 is formed on the interlayer dielectric layer 208. The conductive pattern 210 is connected to the source/drain region 206 through the contact plug 233. A dummy pattern such as a trench isolation 100a can be formed on the semiconductor substrate 100. Since the substrate 100 comprises semiconductor, the insulating layer 170 is formed on the substrate 100 in the cell region.

Figure 10:
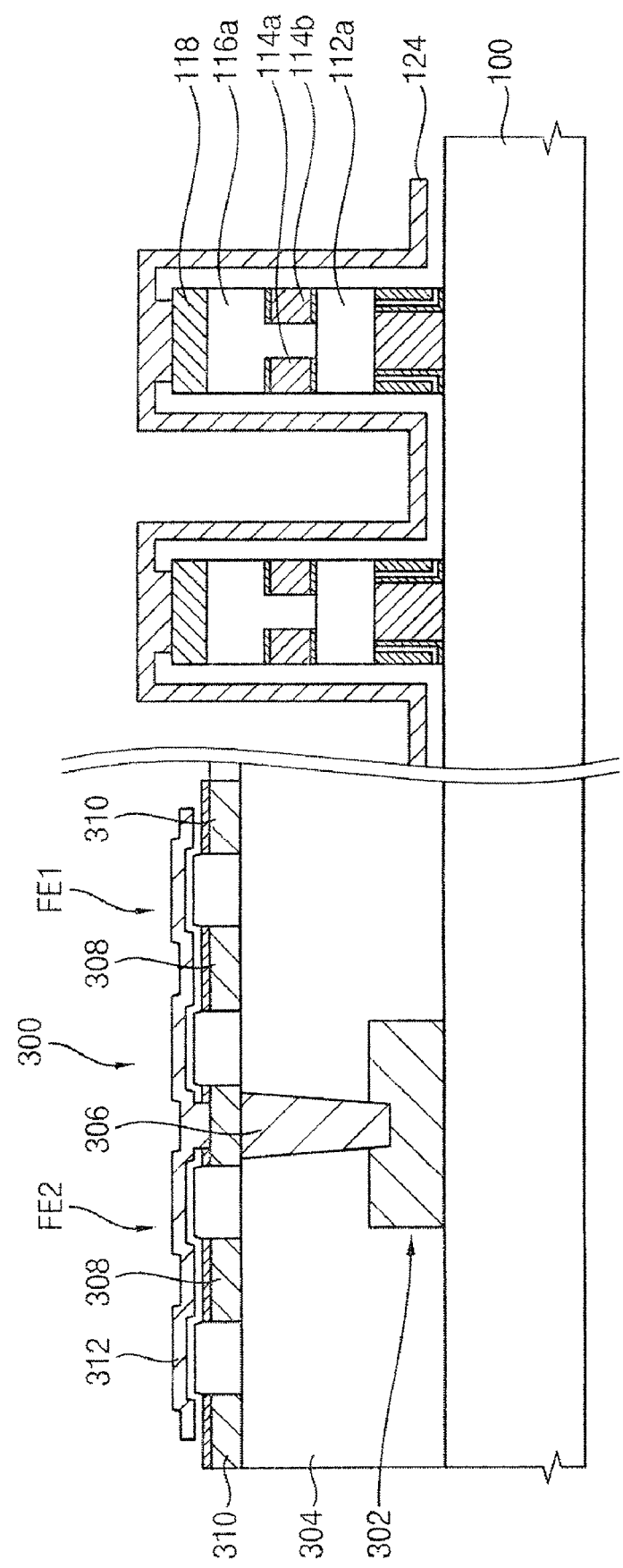
FIG. 10 is a sectional view showing a memory device according to an exemplary embodiment of the present invention.

FIG. 10 is a sectional view showing a memory device according to an exemplary embodiment of the present invention. Referring to FIG. 10, memory cells including an electromechanical switch are formed in the cell region, and a planar switch 300 is formed in the peripheral region. In the peripheral region, a conductive pattern 302 is formed on the substrate 100. An interlayer dielectric layer 304 is formed on the conductive pattern 302 and the substrate 100. A contact plug 306 is formed through the interlayer dielectric layer 304 to contact the conductive pattern 302. A signal line such as a word line 308 and an electrode such as a capacitor 310 are formed on the interlayer dielectric layer 304. A suspended beam line 312 is formed on the contact plug 306. The word line 308 is disposed under the suspended beam line 312. The conductive pattern 302 is electrically connected to the suspended beam line 312 through the contact plug 306.

In an exemplary embodiment, the suspended beam line 312 includes a first flexible extension FE1 and a second flexible extension FE2 extended in opposite directions. The first flexible extension FE1 and the second flexible extension FE2 are disposed on and fixed to the contact plug 306. The suspended beam line 312 can be substantially symmetrical with respect to the contact plug 306. A length of the first flexible extension FE1 can be substantially the same as a length of the second flexible extension FE2. The first and second flexible extensions FE1 and FE2 can be substantially straight. Alternatively, the first and second flexible extensions FE1 and FE2 can have a plurality of recessed and protruding portions conforming to the pattern of the surface disposed under the first and second flexible extensions FE1 and FE2.

In an exemplary embodiment, when the word line 308 is energized, the word line 308 pulls the first extension FE1 of the suspended beam line 308. Then, a tip portion of the first flexible extension FE1 moves to contact the capacitor 310. In this exemplary embodiment, any type of substrate such as, for example, glass or plastic can be used because the MOS transistor is not formed in the peripheral region. The planar switch 300 formed in the peripheral region does not require a semiconductor substrate.

FIGS. 11(A) through 19 show a method of forming a memory device having an electromechanical switch according to an exemplary embodiment of the present invention.

Figure 11A:
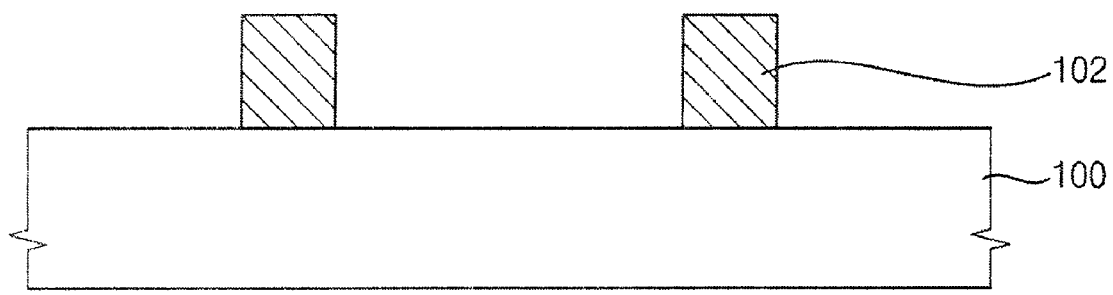
FIGS. 11(A) through 19 show a method of forming a memory device having an electromechanical switch according to an exemplary embodiment of the present invention.
Figure 11B:
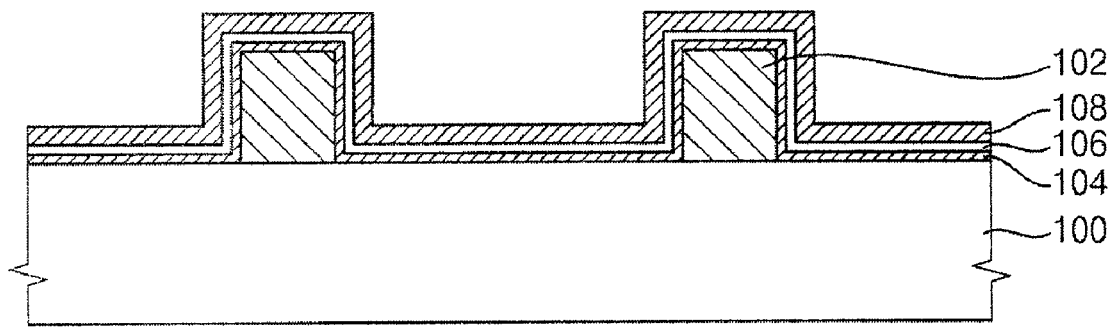
Figure 12:
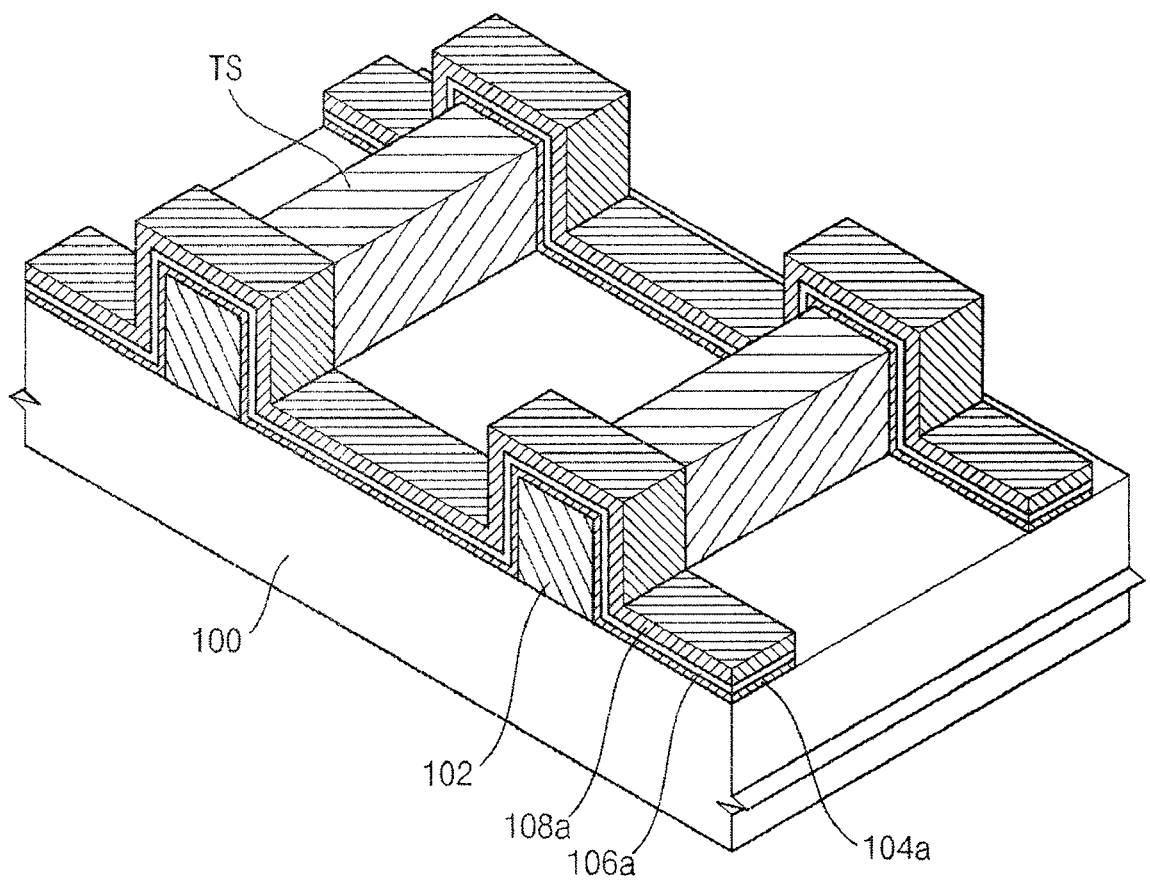

Referring to FIGS. 11(A), 11(B) and 12, a line shaped conductive pattern 102 is formed on the substrate 100. The line shaped conductive pattern 102 can comprise any conductive material such as, for example, tungsten or copper. In an exemplary embodiment, the conductive pattern 102 can comprise metal silicide such as, for example, WSix or CoSix. A first electrode layer 104, a dielectric layer 106, and a second electrode layer 108 are sequentially formed on the conductive pattern 102 and the substrate 100. Then, the first electrode layer 104, the dielectric layer 106, and the second electrode layer 108 are patterned to form a first electrode layer pattern 104a, a dielectric layer pattern 106a, and a second electrode layer pattern 108a. In an exemplary embodiment, photolithography can be used to pattern the above layers. During the patterning, a top surface TS of the conductive pattern 102 can be exposed in an area where the conductive pattern is not formed.

Figure 13A:
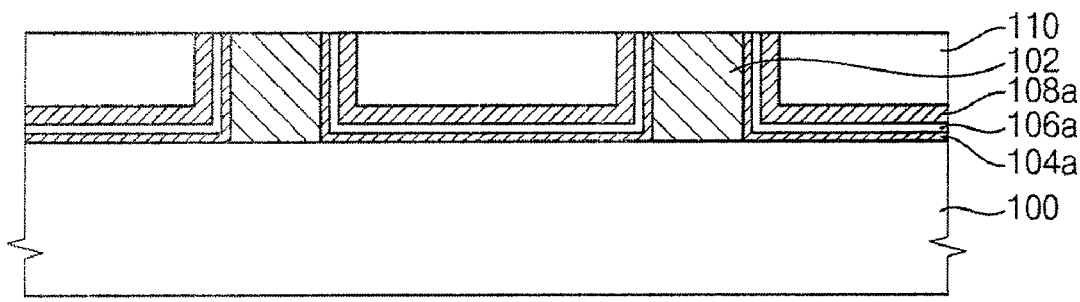
Figure 13B:
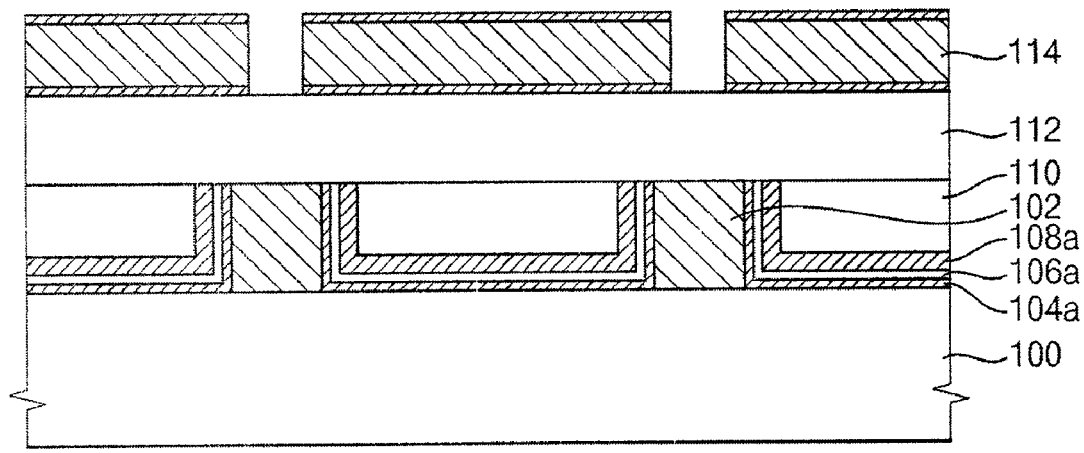

Referring to FIGS. 13(A) and 13(B), a dielectric layer 110 can be disposed on the second electrode layer pattern 108a, the conductive pattern 102, and the substrate 100. In an exemplary embodiment, the dielectric layer 110 can be formed up to the top surface TS of the conductive pattern 102. As such, in a planarization process, layers formed beyond the dielectric layer 110 can be removed. An interlayer dielectric layer 112 is formed on the planarized surface of the conductive pattern 102 and the dielectric layer 110. A preliminary word line layer is formed on the interlayer dielectric layer 112. The preliminary word line layer is patterned to form preliminary word lines 114.

Figure 14A:
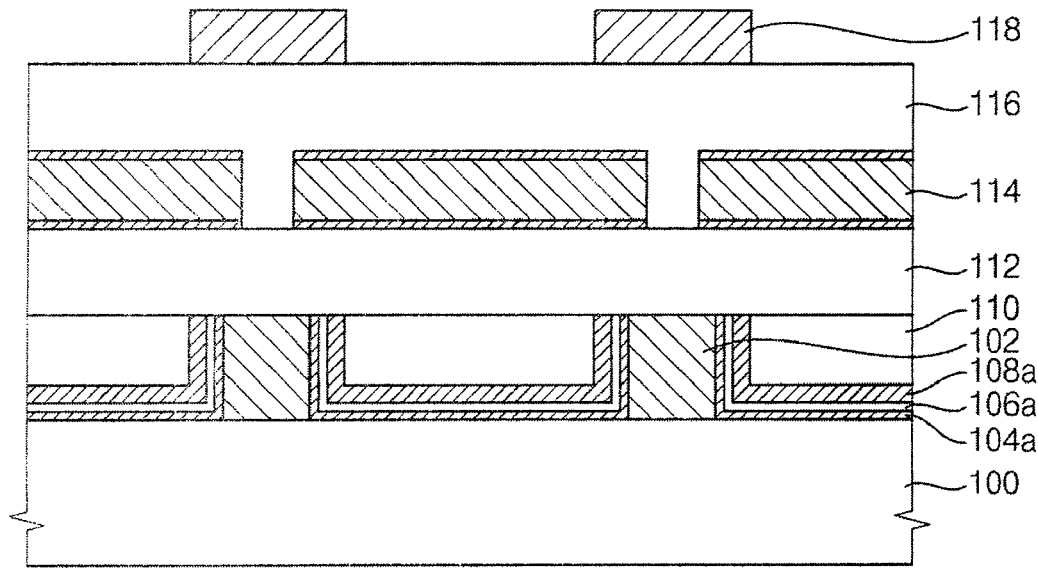
Figure 14B:
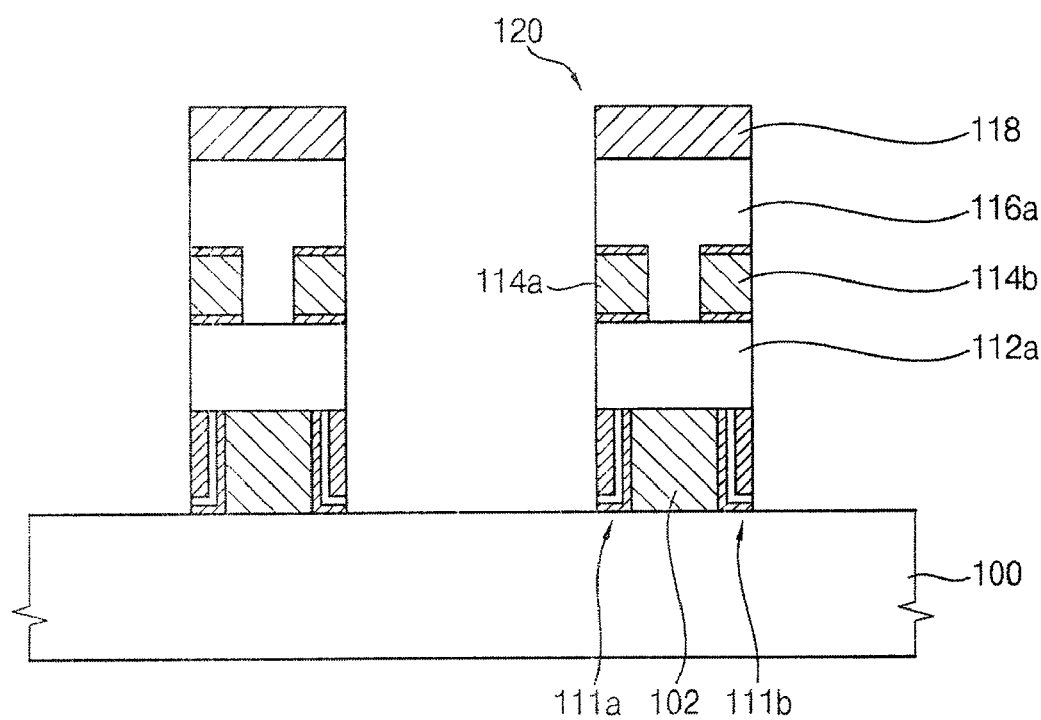
Figure 15:
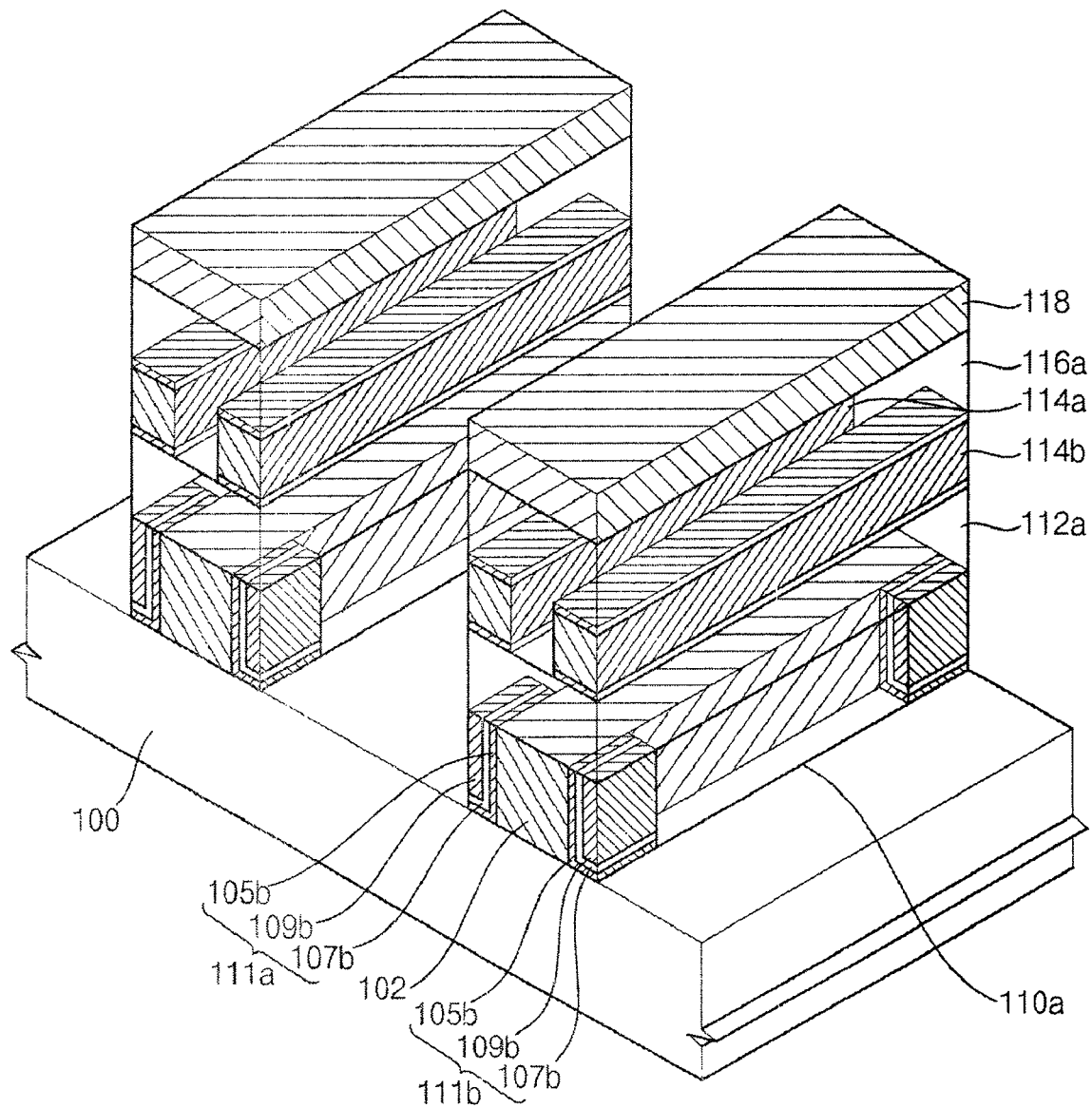

Referring to FIGS. 14(A), 14(B) and 15, a dielectric layer 116 is formed on the preliminary word lines 114. A mask pattern 118 is formed on the dielectric layer 116. Using the mask pattern 118, layers formed thereunder can be patterned. As such, the mask pattern 118, the interlayer dielectric layer pattern 116a, the word lines 114a, 114b, the interlayer dielectric layer pattern 112a, the capacitors 111a, 111b, and the conductive pattern 102 are formed.

Figure 16A:
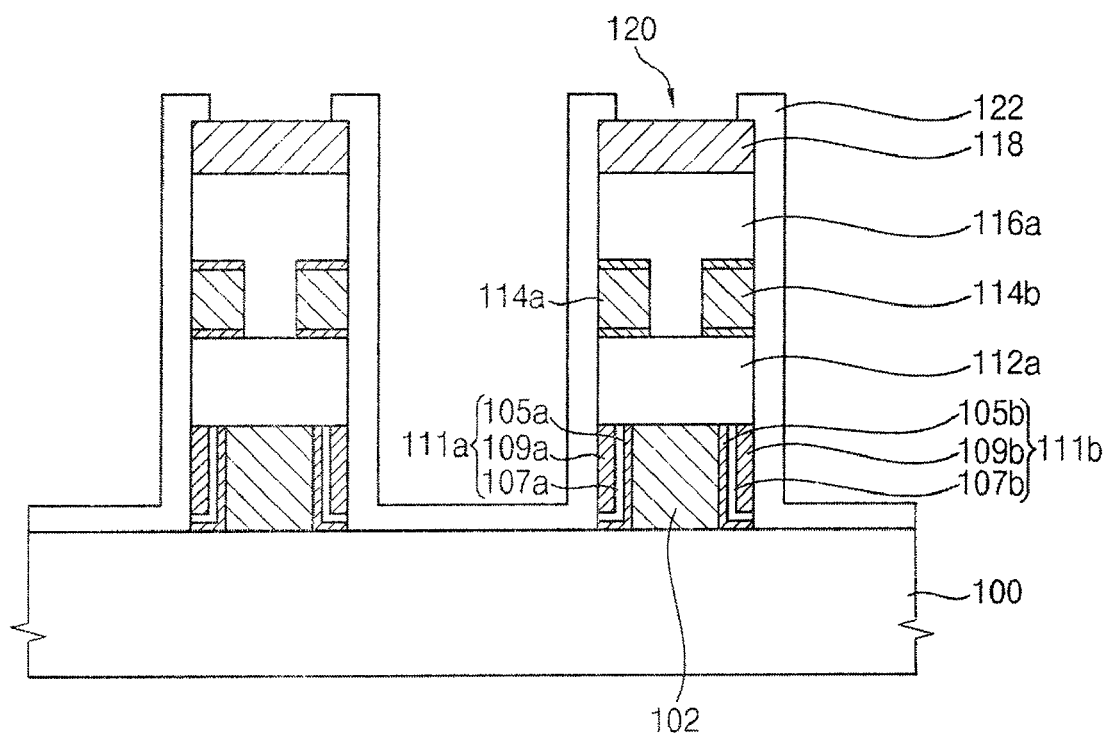
Figure 16B:
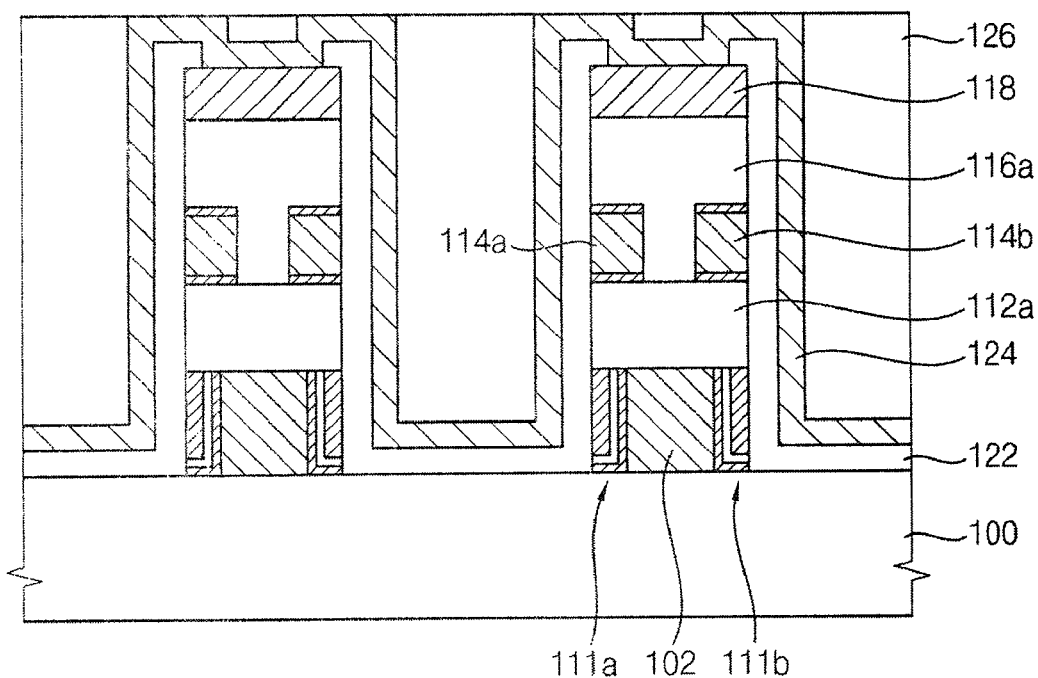

Referring to FIGS. 1, 16(A) and 16(B), a first sacrificial layer 122 is formed on the word lines 114a, 114b, the capacitors 111a, 111b, the mask pattern 118, the interlayer dielectric layers 112a, 116a, and the substrate 100. The first sacrificial layer 122 has an opening 120 exposing a top surface of the mask pattern 118. The first sacrificial layer 122 can have a different etch selectivity from a material comprising the bit line 124a to be formed over the first sacrificial layer 122 in a subsequent process. For example, polysilicon, atomic layer deposition (ALD) oxide, SiGe, SiN, doped silicon, or doped silicon oxide can be used as the first sacrificial layer 122. The distances D1 and D2 can be controlled by the thickness of the first sacrificial layer 122. This is because D1 and D2 correspond to the thickness of the first sacrificial layer 122 which is removed in a subsequent process. In an exemplary embodiment, the first sacrificial layer 122 has a substantially same thickness throughout the entire cell region other than the opening 120. As such, D1 and D2 can be the same. A conductive layer 124 is formed on the first sacrificial layer 122. A second sacrificial layer 126 is formed on the conductive layer 124.

Figure 17A:
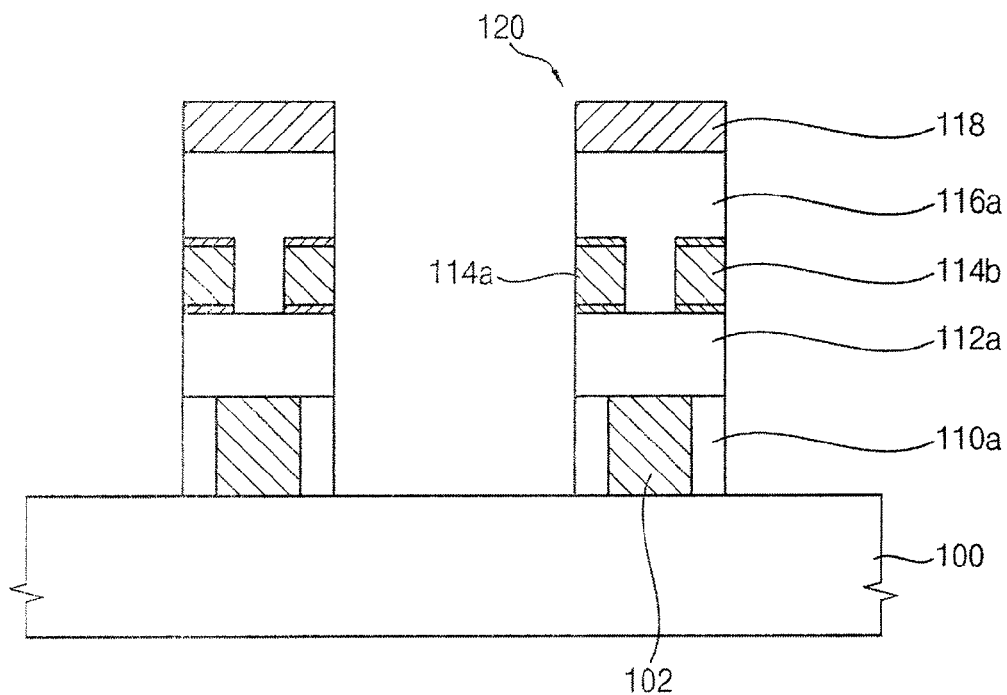
Figure 17B:
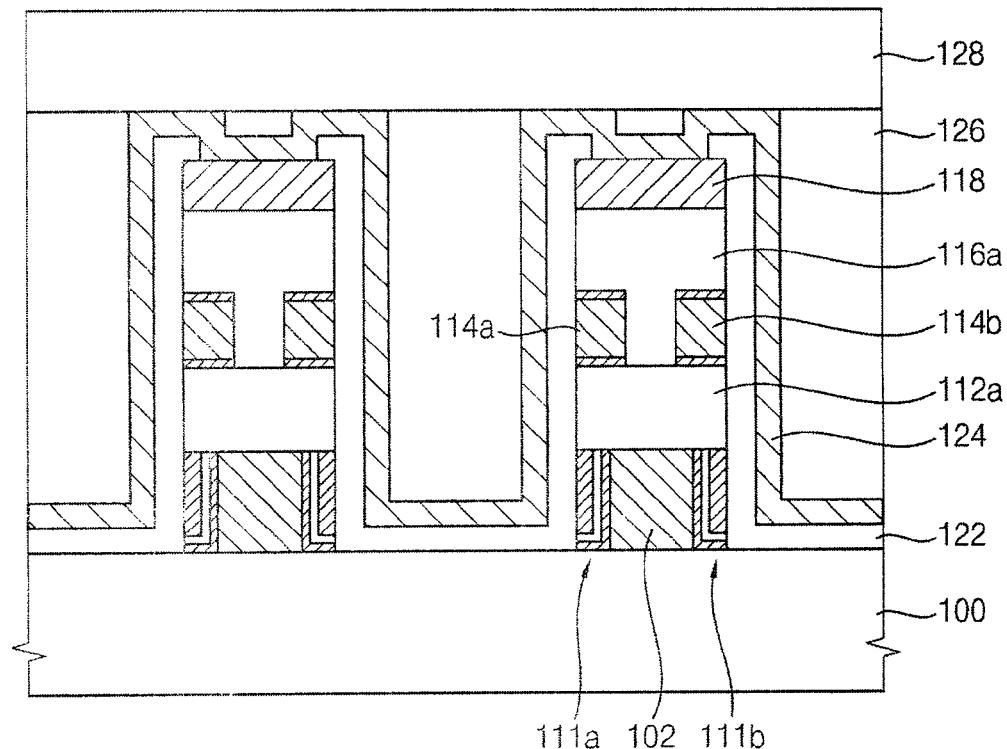
Figure 18:
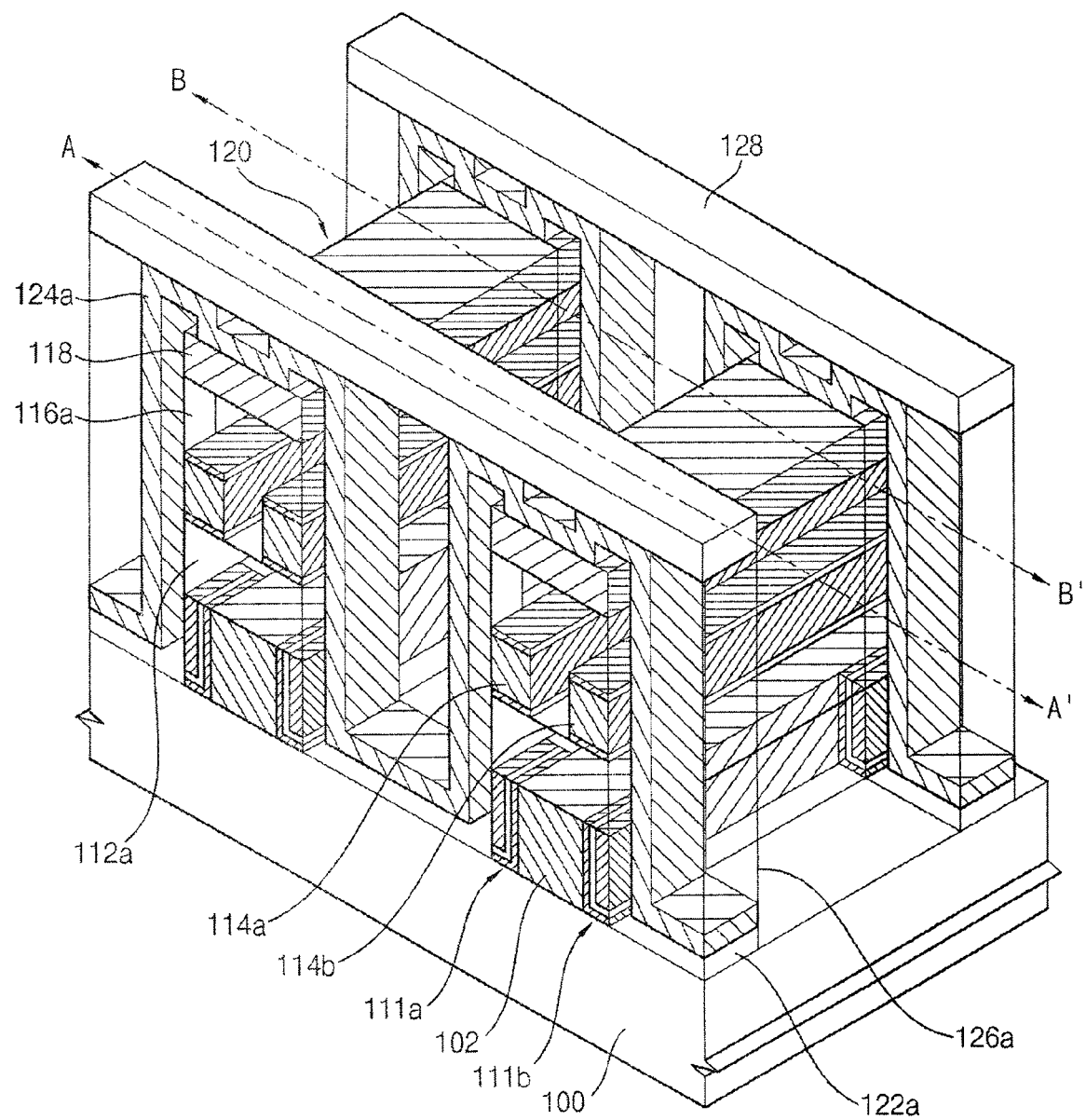

Referring to FIGS. 17(A), 17(B) and FIG. 18, a mask pattern 128 is formed on the conductive layer 124 and the second sacrificial layer 126. The bit line 124*a* is formed after a patterning process using the mask pattern 128. FIG. 17(A) shows a sectional view taken along the line B-B' in FIG. 18 according to an exemplary embodiment of the present invention. FIG. 17(B) shows a sectional view taken along the line A-A' in FIG. 18 according to an exemplary embodiment of the present invention.

Figure 19:
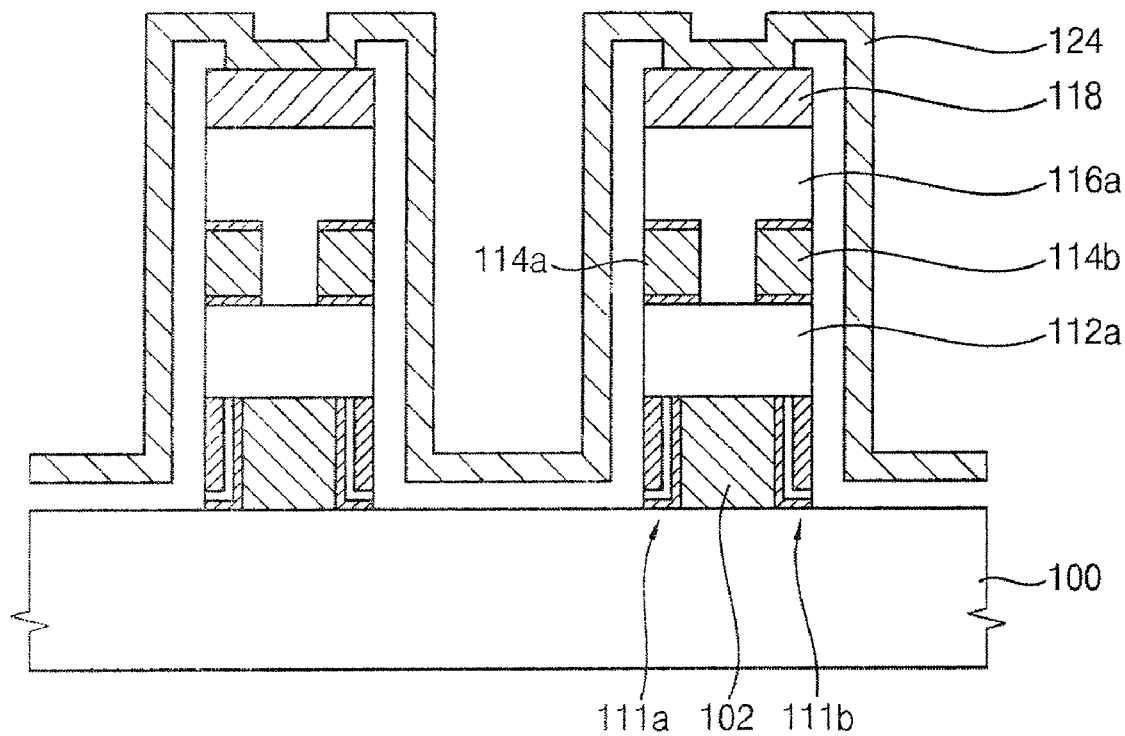

Referring to FIGS. 17(B) and 19, the mask pattern 128, and the first and second sacrificial layers 122 and 140 are removed. In an exemplary embodiment, the first and second sacrificial layers 122 and 140 comprise a same material. When both of the sacrificial layers 122 and 140 are removed in a subsequent process, a space is formed around the bit line 124*a*. The space allows the bit line 124*a* moves, for example, from left to right. The space can be a vacuum state or filled with an inert gas, such as, for example, $N_2$. In an exemplary embodiment, the first and second sacrificial layers 122 and 140 can be removed by a wet etch process.

Figure 20A:
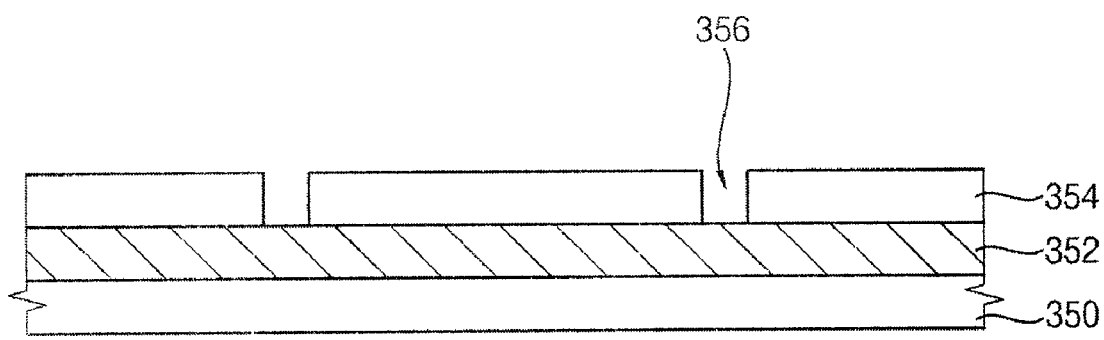
FIGS. 20(A), (B) and (C) show a method of forming the buried conductive pattern 352 according to an exemplary embodiment of the present invention.
Figure 20B:
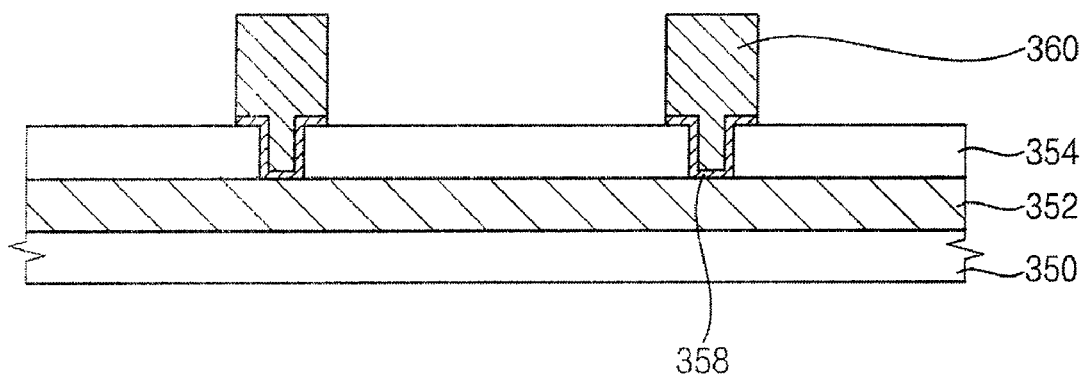
Figure 20C:
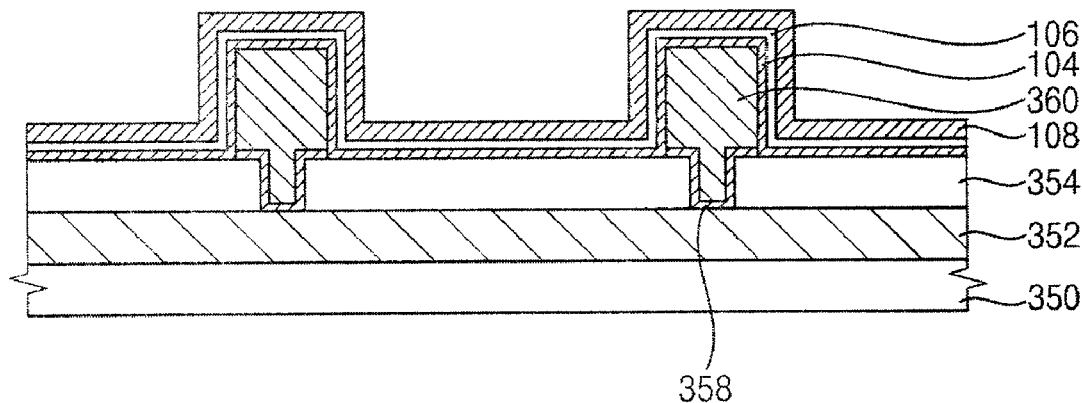

FIGS. 20(A), 20(B) and 20(C) show a method of forming the buried conductive pattern 352 according to an exemplary embodiment of the present invention. Referring to FIGS. 5, 20(A), 20(B) and 20(C), the buried conductive pattern 352 is formed on the substrate 350. The insulating layer 354 having slits 356 is formed the buried conductive pattern 352. A barrier layer pattern 358 is formed along the walls of the slit 356. The conductive pattern 360 having a wider width than the width of the slit 356 is formed on the barrier layer pattern 358, thereby filling the slit 356. The first electrode layer 104, the dielectric layer 106, and the second electrode layer 108 are formed sequentially on the conductive pattern 360 and the insulating layer 354.

Figure 21:
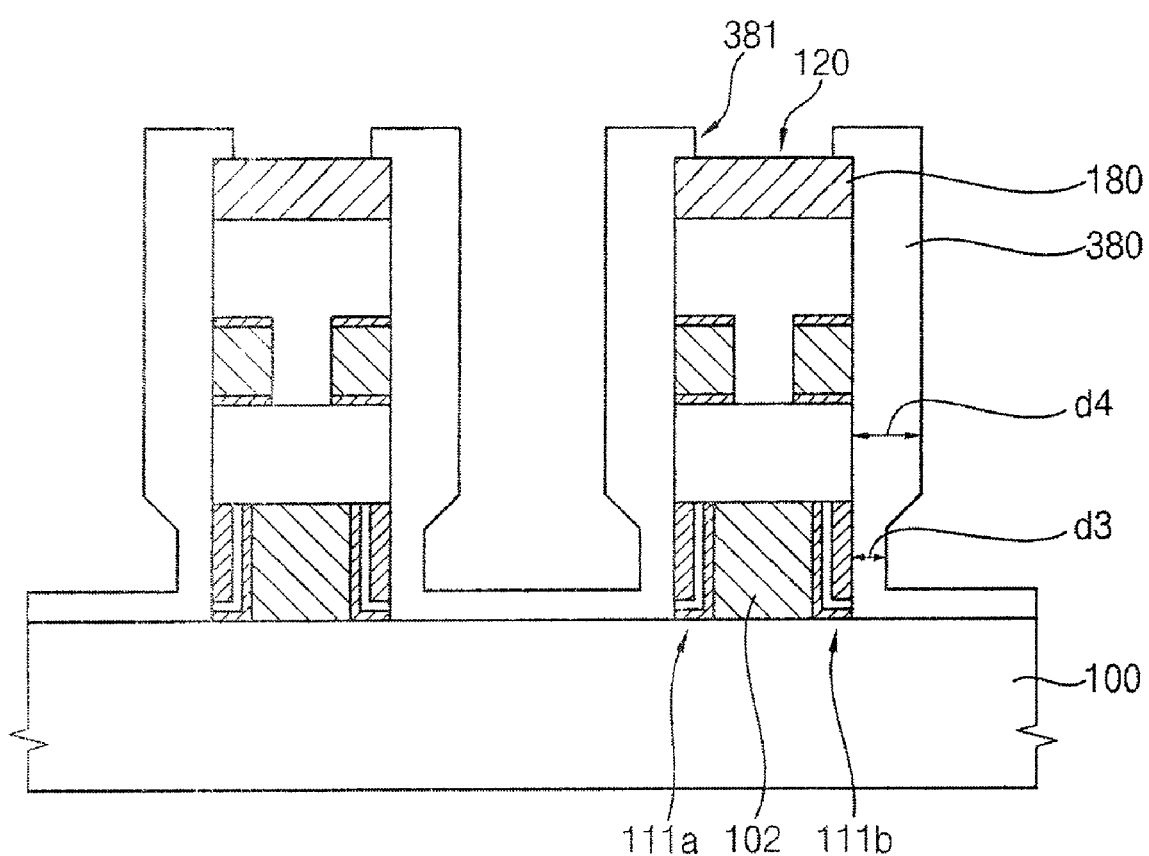
FIG. 21 shows a method of forming a dimpled switch structure according to an exemplary embodiment of the present invention.

FIGS. 6 and 21 show a method of forming a dimpled switch structure according to an exemplary embodiment of the present invention. A first sacrificial layer 380 is formed on the word lines 114*a*, 114*b*, the capacitors 111*a*, 111*b*, the mask pattern 118, the interlayer dielectric layers 112*a*, 116*a*, and the substrate 100. The first sacrificial layer 380 has an opening 120 exposing a top surface of the mask pattern 118. The first sacrificial layer 380 can have a different etch selectivity from a material comprising the bit line 382 to be formed over the first sacrificial layer 380 in a subsequent process. For example, polysilicon, atomic layer deposition (ALD) oxide, SiGe, SiN, doped silicon, or doped silicon oxide can be used as the first sacrificial layer 380. The distances D3 and D4 can be controlled by the thicknesses d3 and d4 of the first sacrificial layer 380. This is because the space distances D3 and D4 in FIG. 6 correspond to the thicknesses d3 and d4 of the first sacrificial layer 380 which is removed in a subsequent process. In an exemplary embodiment, the thickness d3 corresponding to the protruding portion of the bit line 382 is smaller than d4 to form a dimpled gap structure.

Figure 22A:
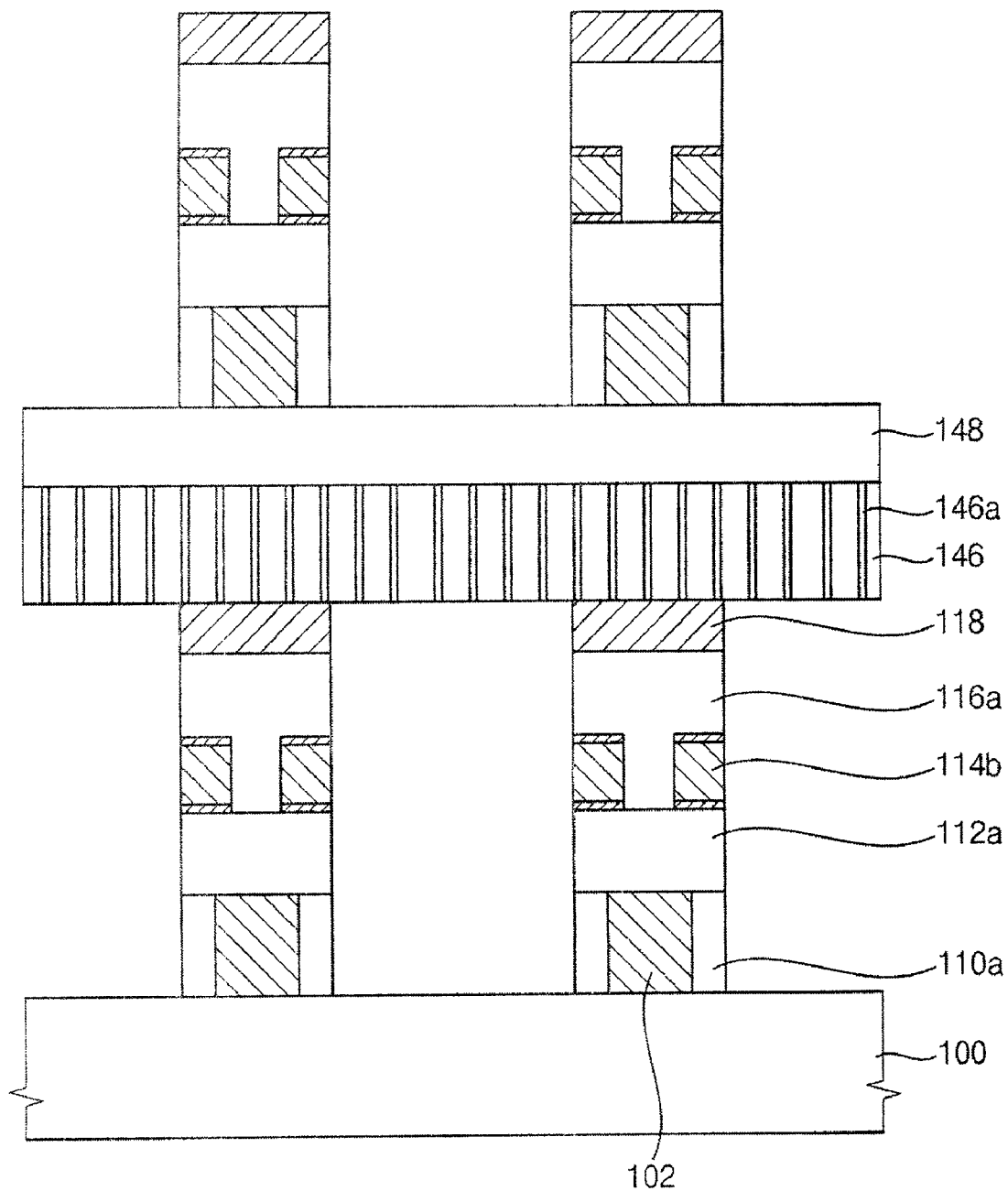
FIGS. 22(A) and 22(B) show a memory device having electromechanical switches according to an exemplary embodiment of the present invention.
Figure 22B:
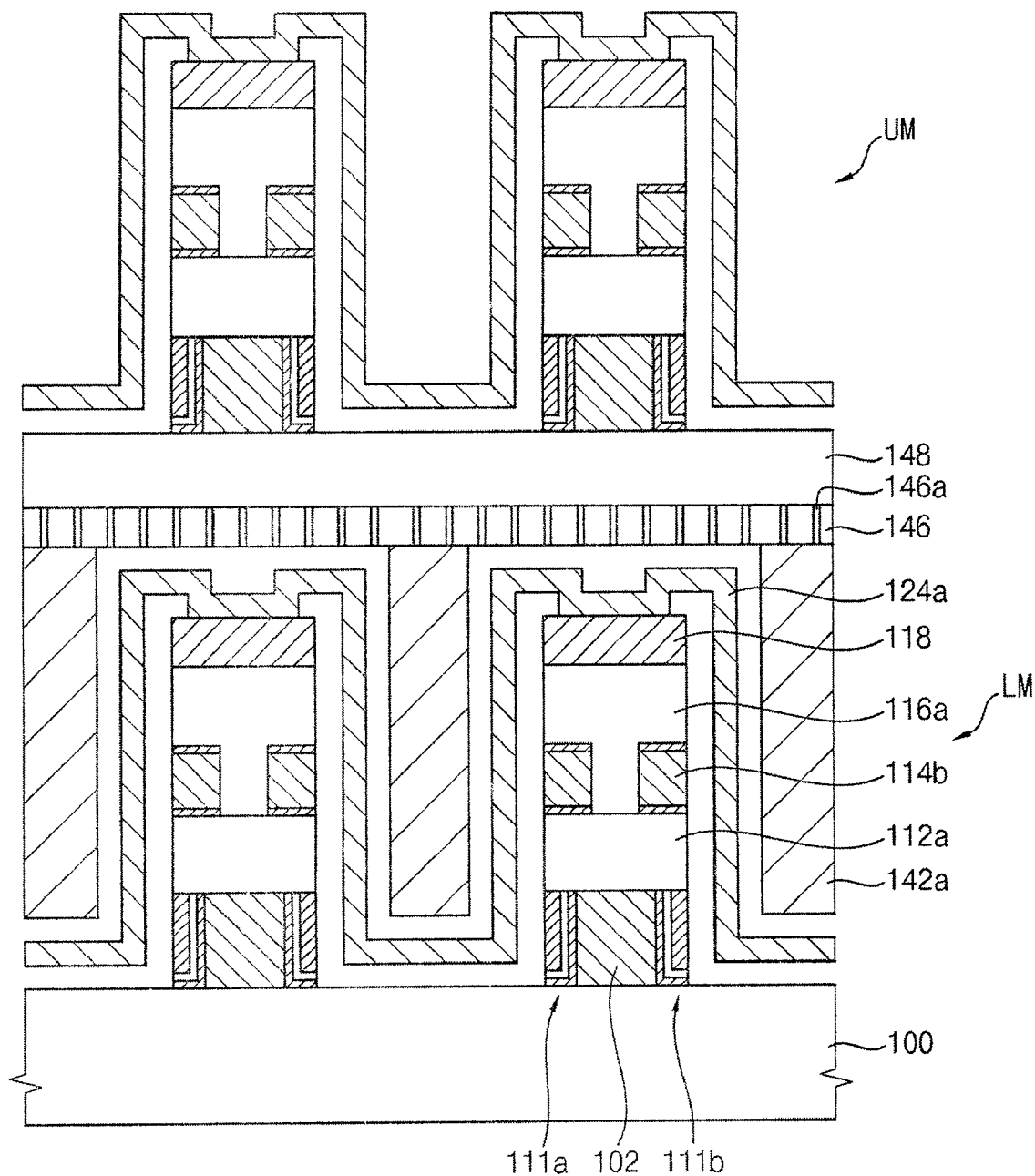

FIGS. 22(A) and 22(B) show a memory device having electromechanical switches according to an exemplary embodiment of the present invention. Referring to FIGS. 22(A) and 22(B), an upper array of memory cells UM are formed on a lower array of memory cells LM with interlayer dielectric layers 146 and 148 therebetween. FIG. 22(A) shows a sectional view of the memory device taken along an area in which bit lines are not formed. FIG. 22(B) shows a sectional view of the memory device taken along an area in which bit lines are formed. In an exemplary embodiment, multiple layers of memory cells can be stacked one over another.

An interlayer dielectric layer 146 having a plurality of fine pores 146*a* is formed on the lower array of memory cells LM. An interlayer dielectric layer 148 is formed on the interlayer dielectric layer 146 having a plurality of fine pores 146*a*. The upper array of memory cells UM can be formed on the interlayer dielectric layer 148. The substrate 100 required in the lower array of memory cells LM can be omitted between the upper and lower memory cells UM and LM because electromechanical switches of exemplary embodiments of the present invention can be formed directly on a dielectric layer. The fine pores 146*a* can be used as paths transmitting gases or liquids to remove sacrificial layers formed around the bit line 124*a*. In an exemplary embodiment, a dielectric pattern 142*a* can be formed between two vertical portions of the bit lines 124*a*. The dielectric pattern 142*a* can control the movement of the bit line 124*a*. For example, the bit line 124*a* cannot swing to the left or to the right beyond the dielectric pattern 142*a*.

FIG. 23 through FIG. 27 show a method of forming a memory device according to an exemplary embodiment of the present invention.

Figure 23:
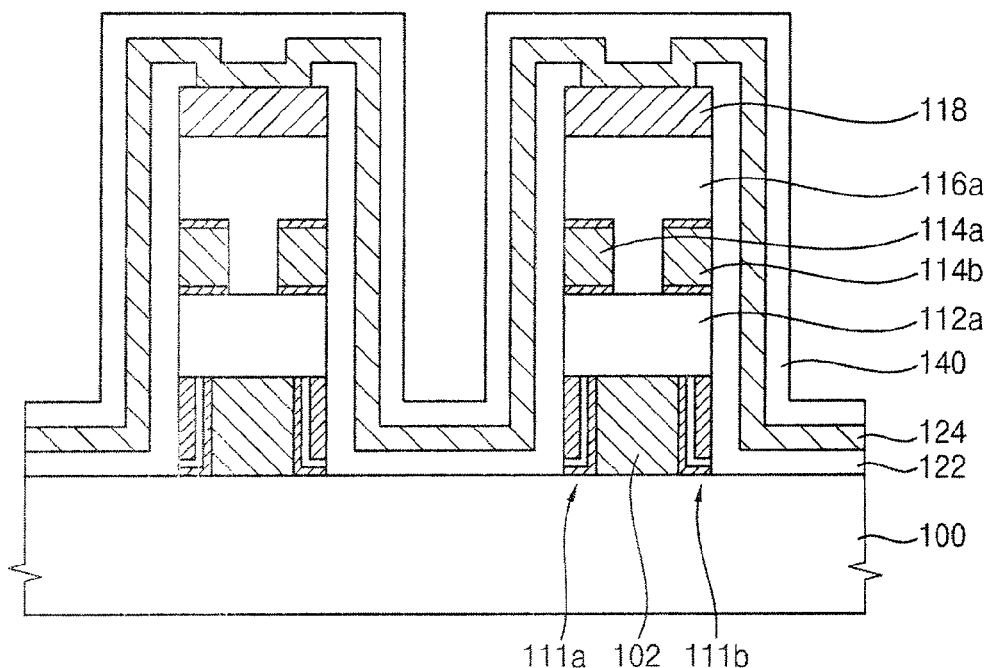
FIG. 23 through FIG. 27 show a method of forming a memory device according to an exemplary embodiment of the present invention.
Figure 24:
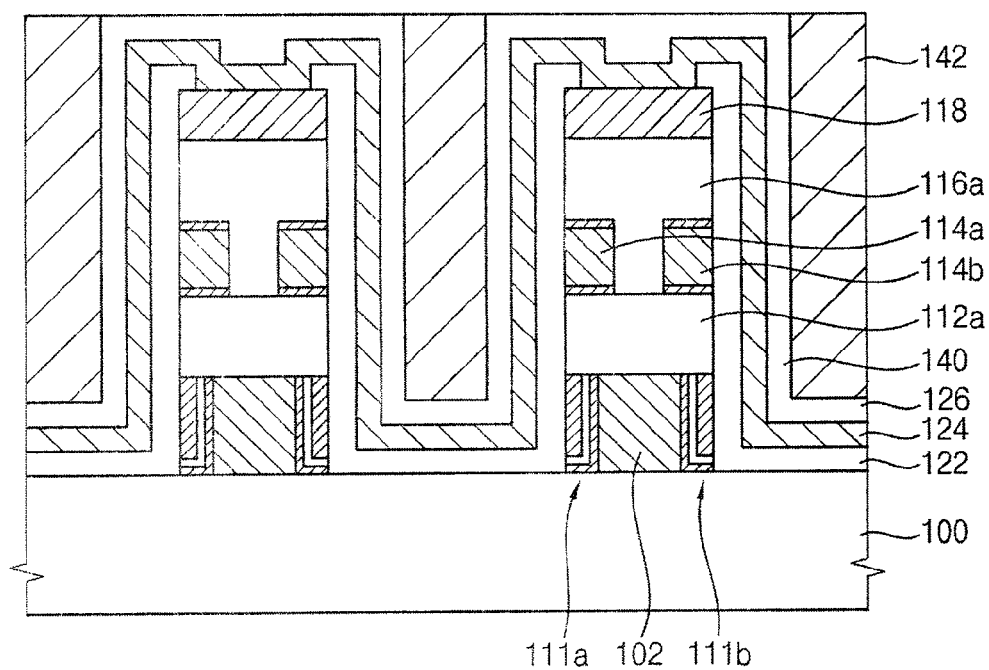
Figure 25A:
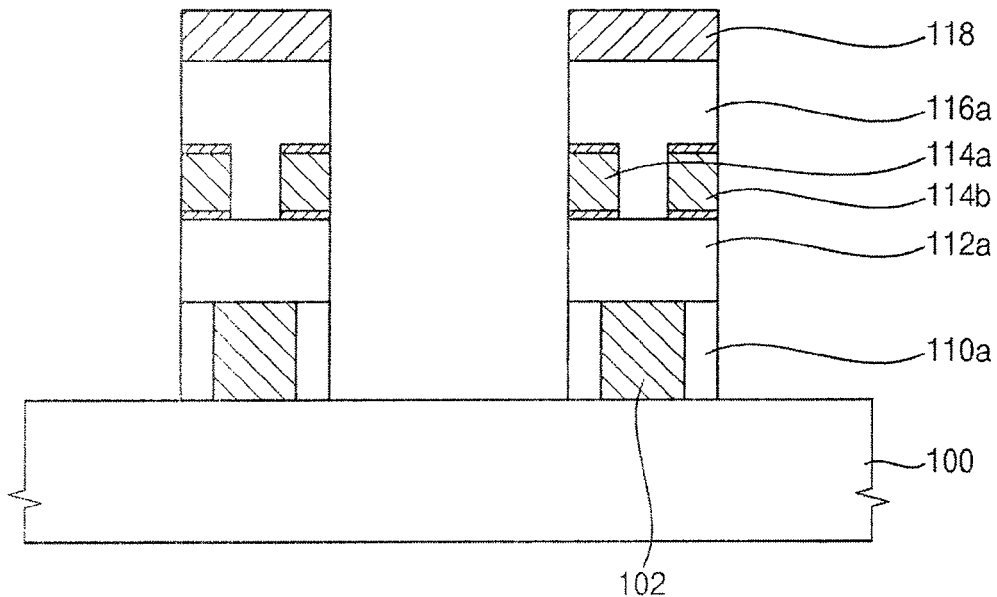
Figure 25B:
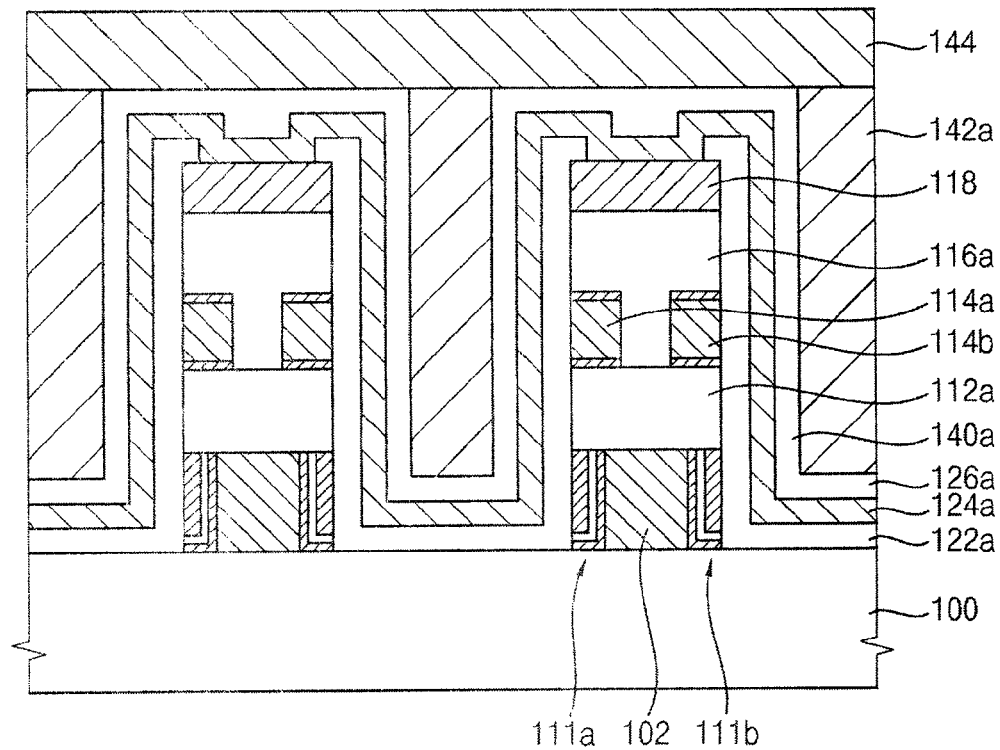

Referring to FIG. 23, the second sacrificial layer 140 can be conformally formed on the conductive layer 124. Referring to FIG. 24, a dielectric pattern layer 142 is formed on the second sacrificial layer 140, thereby filling the space formed between two vertical portions of the bit line 124*a*. FIG. 25(A) shows a sectional view of the memory device taken along an area in which bit lines are not formed. FIG. 25(B) shows a sectional view of the memory device taken along an area in which bit lines are formed. Referring to FIG. 25(B), a mask pattern 144 is formed on the dielectric pattern layer 142 and the second sacrificial layer 140. The conductive layer 124 is patterned using the mask pattern 144 to form the bit line 124*a*. The dielectric pattern layer 142 is patterned to form the dielectric pattern 142*a*.

Figure 26A:
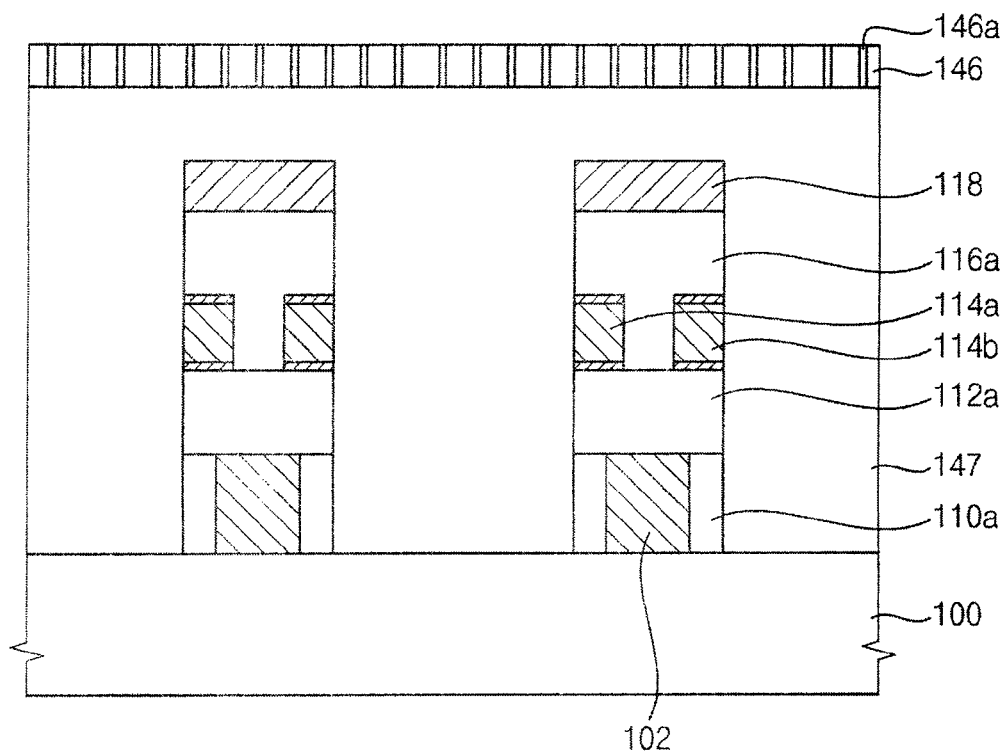
Figure 26B:
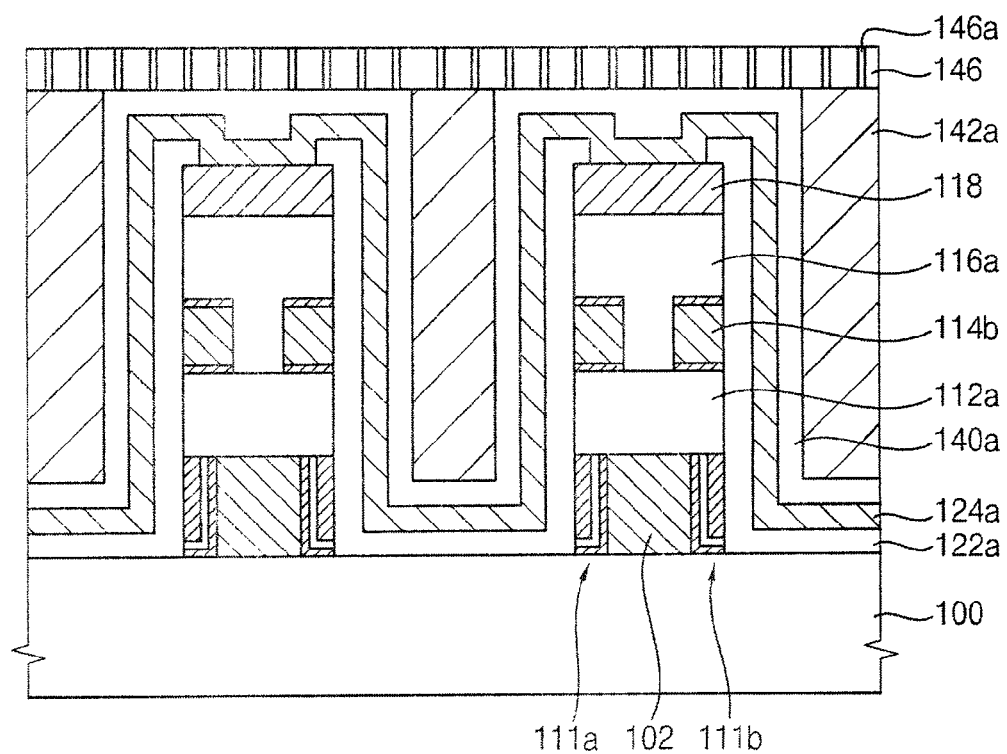

FIG. 26(A) shows a sectional view of the memory device taken along an area in which bit lines are not formed. FIG. 26(B) shows a sectional view of the memory device taken along an area in which the bit lines are formed. Referring to FIG. 26(A), the interlayer dielectric layer 146 having a plurality of fine pores 146*a* is formed on the interlayer insulating layer 147. Referring to FIG. 26(B), after removing the mask pattern 144, the interlayer dielectric layer 146 having a plurality of fine pores 146*a* is formed on the second sacrificial layer 140 and the dielectric pattern 142*a*.

Figure 27:
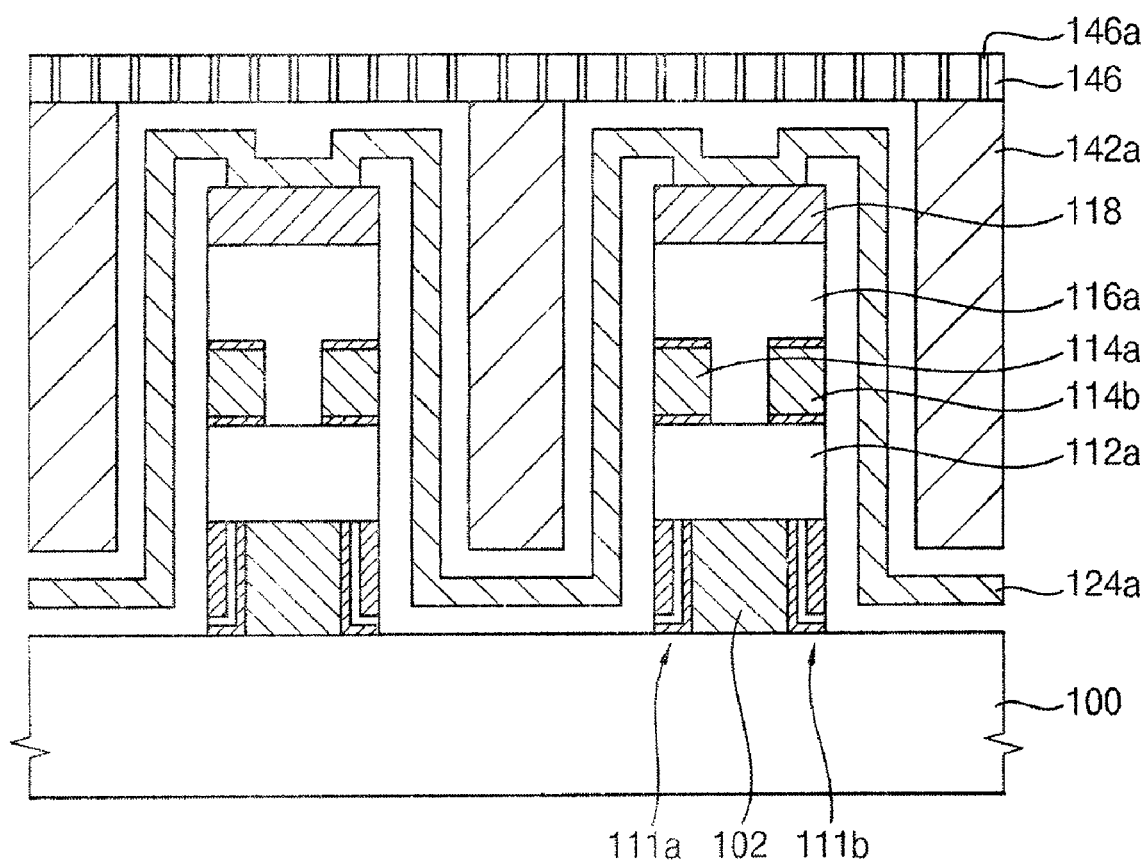

Referring to FIG. 27, the first and second sacrificial layers 122, 140 are removed. The fine pores 146*a* can be used as paths transmitting gases or liquids used in removing the first and second sacrificial layers 122, 140. The removed sacrificial layers 122, 140 can also be transmitted through the pores 146*a*. For example, when the sacrificial layers 122, 140 are removed by a wet etch process, etching chemicals can be transmitted through the fine pores 146*a*. Each fine pore may have a diameter of about 10 nm to about 20 nm. In an exemplary embodiment, the fine pores 146*a* may be formed in a regular pattern. In an exemplary embodiment, the fire pores 146*a* can be formed in the dielectric layer 146 after the dielectric layer 146 is disposed on the second sacrificial layer 140. The dielectric layer 146 may comprise, for example, polystyrene or polymethylmethacrylate (PMMA).

Figure 28:
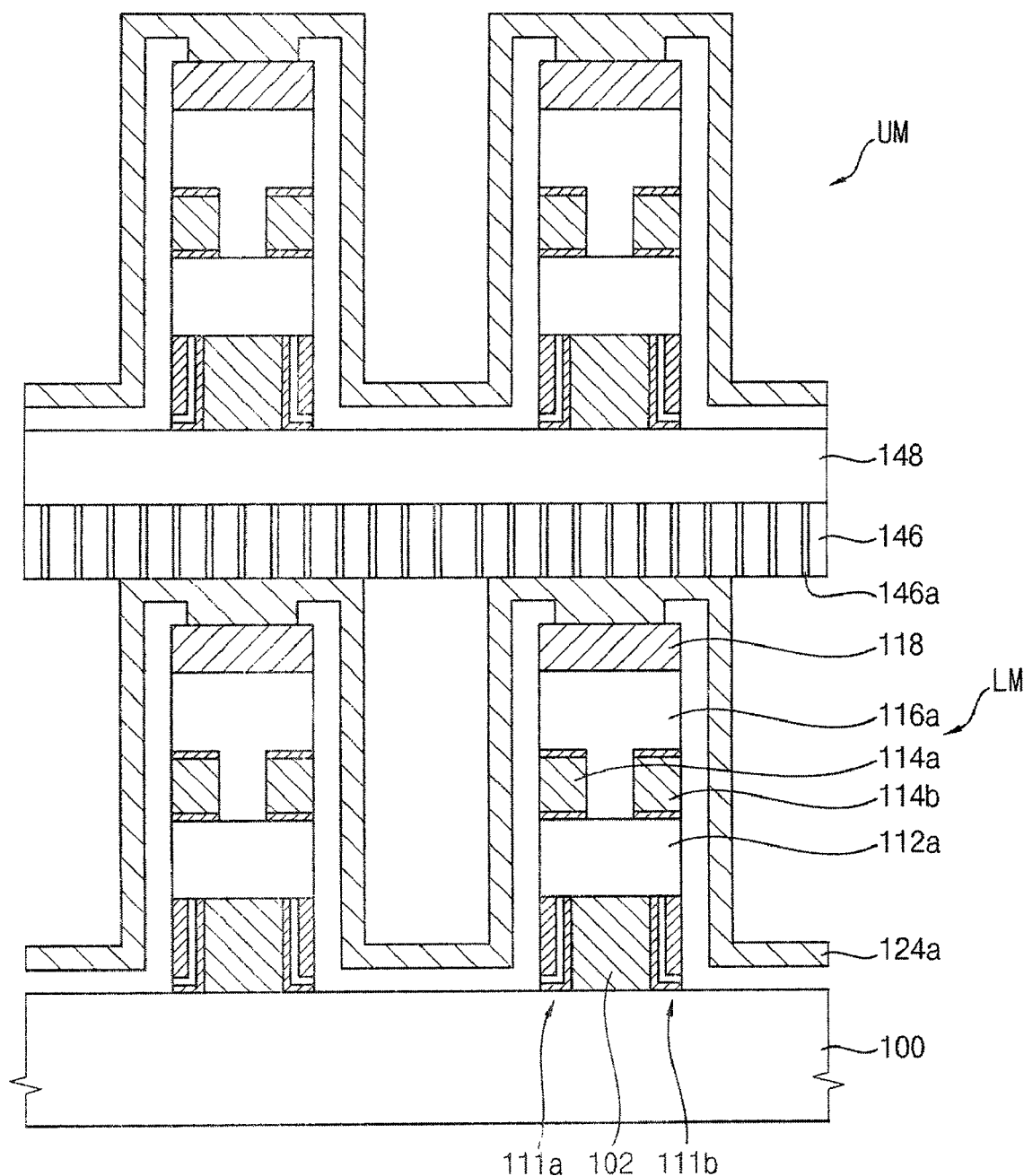
FIG. 28 is a sectional view of a memory device according to an exemplary embodiment of the present invention.

FIG. 28 is a sectional view of a memory device according to an exemplary embodiment of the present invention. Referring to FIG. 28, the upper array of memory cells UM are formed on the lower array of memory cells LM with the interlayer dielectric layers 146 and 148 therebetween. In an exemplary embodiment, multiple layers of memory cells can be stacked one over another. In an exemplary embodiment, the dielectric pattern 142a is not formed between two vertical portions of the bit line 124a.

Figure 29A:
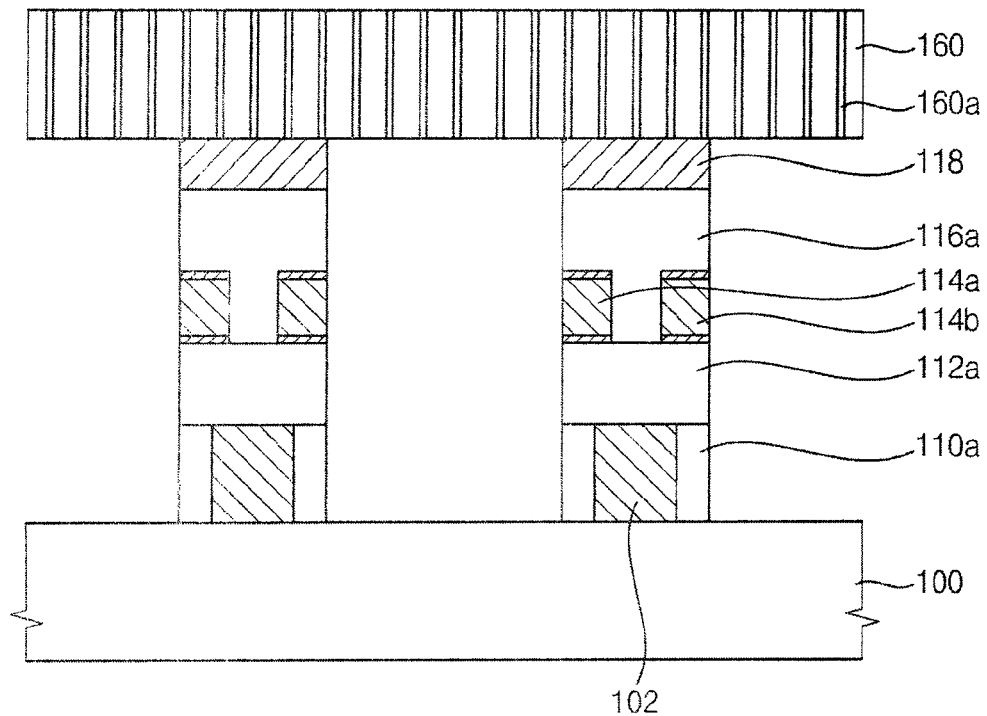
FIGS. 29(A) and 29(B) show a method of forming a memory device according to an exemplary embodiment of the present invention.
Figure 29B:
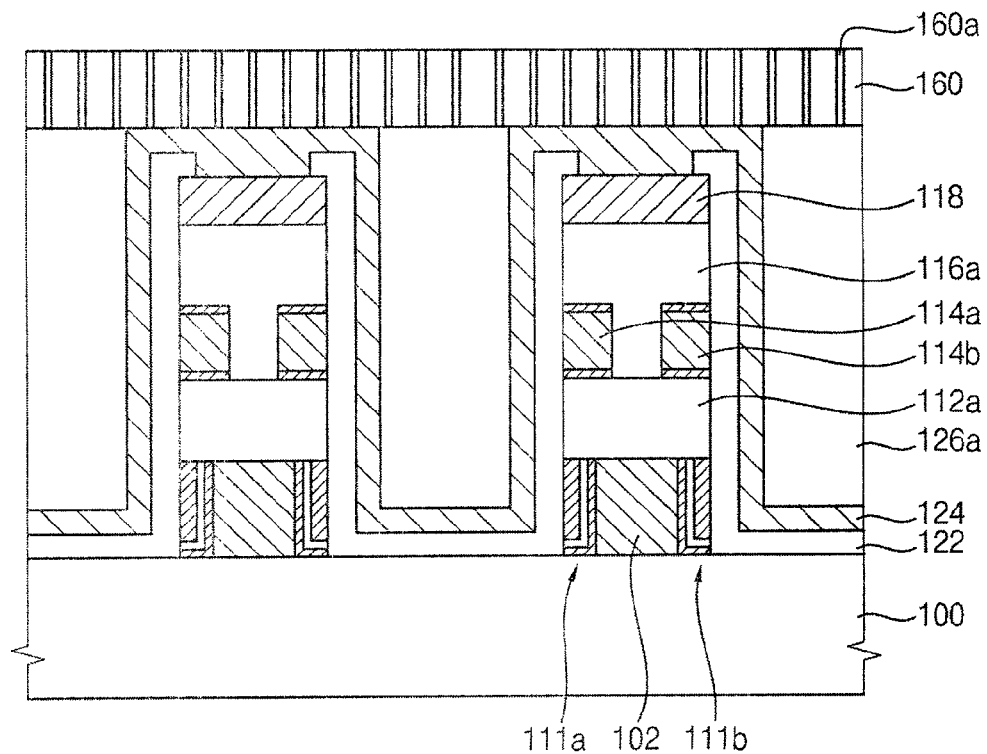

FIGS. 29(A) and 29(B) show a method of forming a memory device according to an exemplary embodiment of the present invention. FIG. 29(A) shows a sectional view of the memory device taken along an area in which bit lines are not formed. FIG. 29(B) shows a sectional view of the memory device taken along an area in which bit lines are formed. Referring to FIG. 29(B), the dielectric pattern 42a is omitted.

FIG. 30 shows a memory device according to an exemplary embodiment of the present invention. Referring to FIG. 30, the lower array of memory cells LM includes MOS transistors in the peripheral region and electromechanical switches in the cell region. The upper array of memory cells UM includes electromechanical switches in the cell region and the peripheral region. The interlayer dielectric layers 146 and 148 are formed between the upper array of memory cells UM and lower array of memory cells LM. In an exemplary embodiment, the planar switch structure shown in FIG. 10 can be used instead of the MOS transistors in the peripheral region of the lower array of memory cells LM.

FIG. 31 shows an electromechanical switch according to an exemplary embodiment of the present invention. The use of a switch 1000 is not limited to a memory device. Referring to FIG. 31, the switch 1000 includes a first electrode, 12, a second electrode 16, and a third electrode 20. The first electrode 12 is formed on a substrate 10. The second electrode 16 is formed on the first electrode 12 with an interlayer dielectric layer 14 therebetween. The third electrode 20 is formed on the second electrode 16 with an interlayer dielectric layer 18 therebetween. The third electrode 20 is separated from the first electrode 12 and the second electrode 16. The third electrode 20 is separated from the substrate 10. A lower edge of the first electrode 20 moves to connect to the first electrode 12 when the second electrode 16 is energized. When the first electrode 12 and the third electrode 20 are connected, the switch 1000 is an ON state. The switch 1000 can have a mirror image with respect to an imaginary line across the center of the switch 1000.

Figure 32:
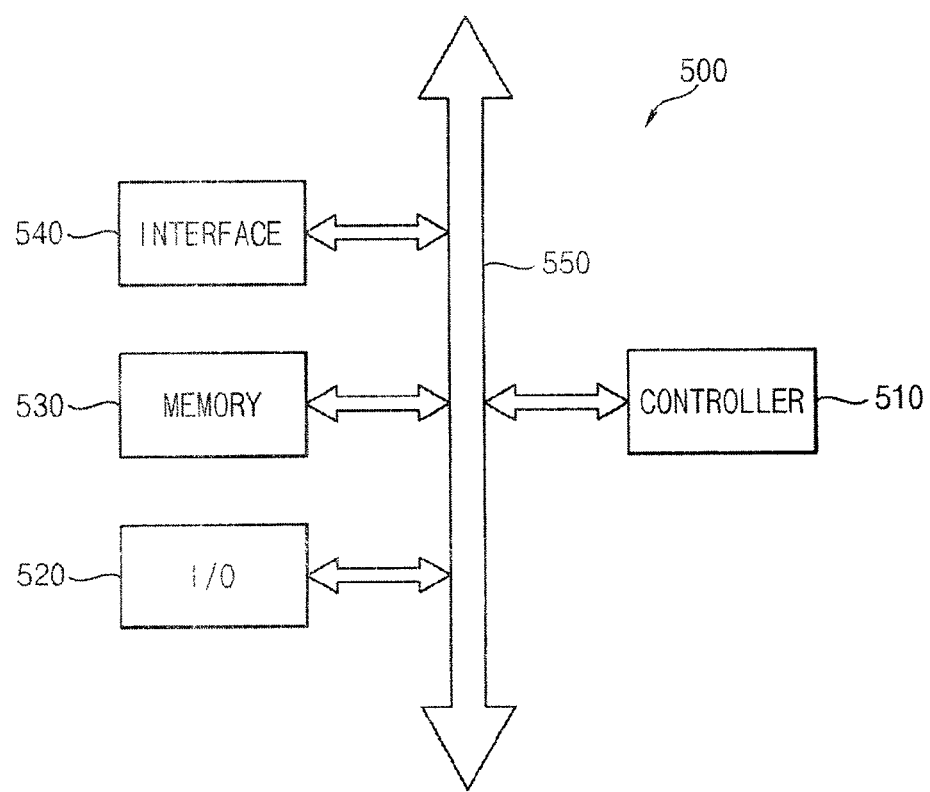
FIG. 32 shows a system including a memory device formed according to an exemplary embodiment of the present invention.

Referring to FIG. 32, a system 500 comprises a controller 510, an input/output device 520, a memory 530, an interface 540, and a bus 550. The system 500 may include a mobile system such as a personal data assistance (PDA), a portable computer, a web tablet, a wireless phone, a mobile phone, a digital music player, or a memory card. In an exemplary embodiment, the system 500 can be any system transmitting and/or receiving information. The controller 510 may include, for example, a microprocessor, a digital signal processor, or a microcontroller. The I/O device 520 may include a keypad, keyboard or display. The memory 530 can include, for example, a DRAM or a flash memory. The memory 530 can store commands executed by the controller 510. The memory 530 and the interface 540 can be combined by the bus 550. The system 500 can use the interface 540 to transmit data into a communication network or to receive data from the communication network.

Exemplary embodiments of the present invention provide a memory device having an electromechanical switch where good retention of charges is achieved due to the low or zero junction leakage in the electromechanical switch.

Exemplary embodiments of the present invention provide a memory device having a vertical structure switch such that a footprint of the unit cell can be reduced.

Exemplary embodiments of the present invention provide a memory device having an electromechanical switch where variety types of substrates can be used because the electromechanical switch can be formed on many different types of substrates.

Exemplary embodiments of the present invention provide a memory device having multiple arrays of memory cells that can be stacked. A high package density can be achieved in the multiple arrays because a substrate can be omitted in between the two adjacent arrays of memory cells.

Exemplary embodiments of the present invention provide an electromechanical switch using an electrode as a part of the switch to open and close the circuit. As such, an additional switch element to open or close the circuit can be omitted.

Exemplary embodiments of the present invention provide a memory device having electromechanical switches which are smaller than the MOS transistors. As such, a size of the memory device according to exemplary embodiments of the present invention can be reduced.

Exemplary embodiments of the present invention provide a method of simultaneously forming electromechanical switches in the cell region and the peripheral region.

Although the exemplary embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A memory device comprising:
a memory cell that includes a storage node, a first electrode, and a second electrode, the storage node configured to store an electrical charge, wherein the first electrode is movable to connect to the storage node when the second electrode is energized, and wherein the second electrode is disposed between the storage node and the first electrode in a direction perpendicular to a major horizontal plane of a substrate on which the memory cell is disposed, wherein the first electrode comprises a vertical portion, a first horizontal portion, and a second horizontal portion, wherein the vertical portion is substantially perpendicular with respect to the major horizontal plane of the substrate, and the first and second horizontal portions are substantially parallel with respect to the major horizontal plane of the substrate, and wherein a first end of the vertical portion is connected to a first end of the first horizontal portion, a second end of the first horizontal portion is fixed to an insulator pattern formed over the second electrode, a second end of the vertical portion is connected to a first end of the second horizontal portion.

2. The memory device of claim 1, wherein a gap is formed between the vertical portion of the first electrode and the storage node and the second electrode.

3. The memory device of claim 2, wherein the second end of the vertical portion is separated from the storage node by the gap when the second electrode is not energized.

4. The memory device of claim 3, wherein the second end of the vertical portion contacts the storage node when the second electrode is energized.

5. The memory device of claim 1, wherein the second end of the vertical portion is protruded toward the storage node.

6. The memory device of claim 1, wherein the second electrode is energized when a voltage is applied.

7. The memory device of claim 1, wherein the storage node comprises a capacitor, the first electrode comprises a bit line, and the second electrode comprises a word line.

8. A memory device comprising:
a memory cell that includes a first electrode, a second electrode, and a storage node, wherein the first electrode is separated from the second electrode by a first gap and is separated from the storage node by a second gap, and the first electrode moves to connect to the storage node when the second electrode is energized, wherein the second electrode is disposed between the storage node and the first electrode in a direction perpendicular to a major horizontal plane of a substrate on which the memory cell is disposed, wherein the first electrode comprises a vertical portion, a first horizontal portion, and a second horizontal portion, wherein the vertical portion is substantially perpendicular with respect to the major horizontal plane of the substrate, and the first and second horizontal portions are substantially parallel with respect to the major horizontal plane of the substrate, and wherein a first end of the vertical portion is connected to a first end of the first horizontal portion, a second end of the first horizontal portion is fixed to an insulator pattern formed over the second electrode, a second end of the vertical portion is connected to a first end of the second horizontal portion.

9. The memory device of claim 8, wherein the first gap and the second gap are substantially the same.

10. A memory device comprising:
a first memory cell including a first word line, a first capacitor, and a first bit line;
a second memory cell including a second word line, a second capacitor, and a second bit line connected to the first bit line;
wherein the first bit line is movable to connect to the first capacitor when the first word line is energized and the second bit line is movable to connect to the second capacitor when the second word line is energized, wherein the first word line is disposed between the first capacitor and the first bit line in a direction perpendicular to a major horizontal plane of a substrate on which the first and second memory cells are disposed, or the second word line is disposed between the second capacitor and the second bit line in the direction perpendicular to the major horizontal plane of the substrate.

11. The memory device of claim 10, wherein the first bit line in the first memory cell comprises a first vertical portion, the second bit line in the second memory cell comprises a second vertical portion, the first and second vertical portions are substantially perpendicular with respect to the major horizontal plane of the substrate and substantially parallel with respect to each other.

12. The memory device of claim 11, wherein an end of the first vertical portion is separated from the first capacitor when the first word line is not energized, and the end of the first vertical portion contacts the first capacitor when the first word line is energized.

13. The memory device of claim 12, wherein the end of the first vertical portion is protruded toward the first capacitor.

14. The memory device of claim 11, wherein an end of the second vertical portion is separated from the second capacitor when the second word line is not energized, and the end of the second vertical portion contacts the second capacitor when the second word line is energized.

15. The memory device of claim 14, wherein the end of the second vertical portion is protruded toward the second capacitor.

16. The memory device of claim 10, wherein the first word line and the second word line are energized when a voltage is applied.

17. The memory device of claim 10, wherein an insulator pattern is formed over the first word line and the second word line, and the first and second bit lines are fixed to the insulator pattern.

18. The memory device of claim 17, wherein the first and second bit lines are substantially symmetrical with respect to the insulator pattern.

19. A memory device comprising:
a substrate;
a capacitor formed on the substrate, the capacitor storing an electrical charge;
a word line disposed over the capacitor;
a bit line fixed to an insulator pattern formed over the word line, the bit line is separated from the word line and the capacitor with a gap, the bit line having a vertical portion substantially perpendicular with respect to a major horizontal plane of the substrate;
a first interlayer dielectric layer formed between the word line and the capacitor; and
a second interlayer dielectric layer formed between the word line and the insulator pattern,
wherein the vertical portion of the bit line is movable to connect to the capacitor when the word line is energized, wherein the word line is disposed between the capacitor and the bit line in a direction perpendicular to the major horizontal plane of the substrate.

20. The memory device of claim 19, wherein the bit line further comprises a parallel portion, a first end of the parallel portion is connected to a first end of the vertical portion and a second end of the parallel portion is fixed to the insulator pattern.

21. The memory device of claim 20, wherein a second end of the vertical portion of the bit line is separated from the capacitor when the word line is not energized.

22. The memory device of claim 21, wherein a second of the vertical portion of the bit line contacts the capacitor when the word line is energized.

23. The memory device of claim 19, wherein the word line is energized when a voltage is applied.

24. The memory device of claim 19, wherein the bit line comprises at least two layers.

* * * * *